United States Patent
Matsuda et al.

(10) Patent No.: US 7,294,818 B2
(45) Date of Patent: Nov. 13, 2007

(54) SOLID STATE IMAGE PICKUP DEVICE AND IMAGE PICKUP SYSTEM COMPRISING IT

(75) Inventors: Takashi Matsuda, Atsugi (JP); Akira Okita, Yamato (JP)

(73) Assignee: Canon Kabushiki Kaisha, Tokyo (JP)

( * ) Notice: Subject to any disclaimer, the term of this patent is extended or adjusted under 35 U.S.C. 154(b) by 101 days.

(21) Appl. No.: 11/207,755

(22) Filed: Aug. 22, 2005

(65) Prior Publication Data

US 2006/0043261 A1  Mar. 2, 2006

(30) Foreign Application Priority Data

Aug. 24, 2004  (JP) .............................. 2004-243602

(51) Int. Cl.
*H04N 5/217* (2006.01)

(52) U.S. Cl. .................... 250/208.1; 348/241; 438/69

(58) Field of Classification Search ............. 250/239, 250/208.1; 257/239, 223; 348/241; 438/60, 438/69

See application file for complete search history.

(56) References Cited

U.S. PATENT DOCUMENTS

| | | | |
|---|---|---|---|
| 5,796,154 A | 8/1998 | Sano et al. | 257/432 |
| 6,030,852 A * | 2/2000 | Sano | 438/69 |
| 6,133,062 A | 10/2000 | Pai et al. | |
| 6,376,872 B1 | 4/2002 | Pai et al. | |
| 2002/0158974 A1* | 10/2002 | Udo | 348/241 |
| 2004/0169125 A1* | 9/2004 | Yamada | 250/208.1 |
| 2005/0098805 A1 | 5/2005 | Okita et al. | 257/292 |
| 2005/0122418 A1 | 6/2005 | Okita et al. | 348/340 |
| 2005/0168618 A1 | 8/2005 | Okita et al. | 348/335 |
| 2005/0174552 A1 | 8/2005 | Takada et al. | 355/53 |
| 2005/0179796 A1 | 8/2005 | Okita et al. | 348/308 |
| 2006/0043393 A1 | 3/2006 | Okita et al. | 257/93 |
| 2006/0044434 A1 | 3/2006 | Okita et al. | 348/294 |
| 2006/0157759 A1 | 7/2006 | Okita et al. | 257/292 |
| 2006/0158539 A1 | 7/2006 | Koizumi et al. | 348/300 |
| 2006/0158543 A1 | 7/2006 | Ueno et al. | 348/308 |

* cited by examiner

*Primary Examiner*—Thanh X. Luu
*Assistant Examiner*—Tony Ko
(74) *Attorney, Agent, or Firm*—Fitzpatrick, Cella, Harper & Scinto

(57) ABSTRACT

A solid state image pickup apparatus that can read a signal charge correctly is provided. A peripheral area of a photoelectric conversion area 400 where photoelectric conversion pixels are formed has common output line forming areas 401a and 401b where common output lines for transmitting electric signals from the above described photoelectric conversion area. A plurality of inner lenses are formed in a constant pitch in an inner lens forming area 402 including a photoelectric conversion area 400 and the above-described peripheral area. A plurality of inner lenses located in the outer peripheral part of the inner lens forming area 402 are arranged not to overlap with the common output lines.

6 Claims, 17 Drawing Sheets

SOLID STATE IMAGE PICKUP DEVICE AND IMAGE PICKUP SYSTEM COMPRISING IT

BACKGROUND OF THE INVENTION

1. Field of the Invention

The present invention relates to a solid state image pickup device used for a scanner, a video camera and a digital still camera etc.

2. Related Background Art

In recent years, a solid state image pickup device called a CMOS sensor which utilizes a CMOS process has been catching attention. Due to their readiness for mixed loading of peripheral circuits, low-voltage drive and the like, CMOS sensors are expected for utility, in particular, to mobile information apparatuses. On the other hand, performances required for a solid state image pickup device is enhanced, and multiplication of pixels and miniaturization are regarded as indispensable problems.

Solid state image pickup devices have no choice but to undergo reduction in pixel size in case of undergoing multiplication of pixels. Reduction in pixel size will result in reduction in luminous quantity coming into a pixel. Drop of sensitivity worsens the S/N ratio to deteriorate image quality. Therefore, in case of reducing the pixel size, it will become a problem how to maintain a high level of sensitivity. As a technique to maintain a high level of sensitivity, a method of forming an on-chip micro lens above (more specifically, at the uppermost part of) a photo-detect part (photodiode) which configures a pixel is known.

However, with further fining of pixels, necessity of further improvement of sensitivity has arisen. Only forming an on-chip micro lens as described above at the uppermost part, it has become difficult to derive sufficient light-condensing efficiency. Therefore, in order to enhance light-condensing efficiency further, inner lens structure with a lens to be formed not only at the uppermost part of a lamination structure but also in its inside is proposed (see U.S. Pat. Nos. 5,796,154 and 6,030,852). This inner lens is formed in an inter-layer film immediately above a photo-detect part which implements photoelectric conversion. Likewise the on-chip micro lens, the incident light is refracted on the interface at either the upper surface side or the lower surface side of the inner lens and lead to the photodetect part. In case of using an inner lens and an on-chip micro lens at the same time, the light condensed by the on-chip lens can be further condensed with the inner lens so that light-condensing efficiency as a whole of a solid state image pickup device can be further enhanced.

FIG. 13 shows a schematic configuration of a MOS-type sensor to which a solid state image pickup device comprising the above described inner lens is applied. This MOS-type sensor includes the following configurations. Reference numeral 100 denotes a sensor array with a plurality of photoelectric conversion elements 110 arranged two-dimensionally. Reference numeral 120 denotes a vertical shift register circuit which selects the photoelectric conversion elements 110 on a line-by-line basis. Reference numeral 130 denotes line memory circuits including signal components retaining capacitance Cts and reset components retaining capacitance Ctn respectively retaining signal components (S) and reset (noise) components (N) of the photoelectric conversion elements 110 selected with the vertical shift register circuit 120. Reference numeral 140 denotes a horizontal shift register circuit which selects two pieces of data simultaneously at a time from the signal data in a line retained in the line memory circuit 130. Reference numerals 150a and 150b denote S-N reading circuits which amplify and output difference between the signal components (S) and the reset components (N) on the data simultaneously selected with the horizontal shift register circuit 140.

The S-N reading circuit 150a has an input terminal to which an S-common output line Ch1s is connected and the other input terminal to which an N-common output line Ch1n is connected. The S-N reading circuit 150b has an input terminal to which an S-common output line Ch2s is connected and the other input terminal to which an N-common output line Ch2n is connected. These N-common output lines Ch1n and Ch2n as well as S-common output lines Ch1s and Ch2s are common out lines 160.

To the S-common output line Ch1s, lines including the retaining capacitor Cts of the photoelectric conversion elements 110 on the odd rows are connected commonly. To the N-common output line Ch1n, lines including the retaining capacitance Ctn of the photoelectric conversion elements 110 on the odd rows are connected commonly. To the S-common output line Ch2s, lines including the retaining capacitor Ctn of the photoelectric conversion elements 110 on the even rows are connected commonly. To the N-common output line Ch2n, lines including the retaining capacitor Cts of the photoelectric conversion elements 110 on the even row are connected commonly.

Reading of data from the line memory circuit 130 to the common output line 160 is determined by the following relationship of capacitance. One is wiring capacitance that arises between retaining capacitance Ct included in the line memory circuit 130 and the common output line 160 mainly at the ground point. The other is capacitance Ch being source-gate in-between and source-back gate in-between capacitance of a MOS switch connected to the common output line 160. And according to the gain determined with these capacitance division proportion (Ct/(Ct+Ch)), reading is implemented. In each of the S-N reading circuits 150a and 150b, a signal charge (S) is read to the S-common output line according to the capacitance division proportion gain. Likewise, to the N-common output line, a reset component (N) is read according to the capacitance division proportion gain and a difference signal (Ax((Cts/(Cts+Chs)Vs−Ctn/(Ctn+Chn)Vn)) is outputted. Here, reference character A denotes amplifying ratio of the amplifier. According to this S-N reading, picking up difference signals, the noise components (fixed pattern noise arising at pixels) included in signal charges are cancelled.

However, in the image pickup device comprising the above described conventional inner lens, there is a problem as follows.

FIGS. 14A to 14C show a procedure of forming an inner lens. An inner lens is generally formed with procedure as follows. At first, on a semiconductor substrate 200, an element separating area 201, a photodiode area 202, an insulating film 203 and a shielding film 204 are formed with a predetermined order and the surface (the upper surface of the insulating film 203) is flattened. Subsequently, on the flattened surface, an inner lens material film 205 made of SiN, SiON or $SiO_2$ is formed with the CVD method (chemical vapor depositing method), and moreover thereon etching masks 206 are formed with the photolithographic steps (see photograph 14A). These etching masks 206 are masks for forming inner lenses in the inner lens material film 205, the masked parts are arranged to shape islands so as to be located immediately above each photodiode area 202.

Subsequently, the etching masks 206 undergo reflow with heat processing so as to make the masked parts into a convex shape 206a being substantially the same as a shape of objective inner lens (see FIG. 14(b)). In addition, introducing etching gas selected from the group consisting of $CF_4$, $CHF_3$, $O_2$, Ar, He and the like, the inner lens forming film 205 in its entirty undergoes gas etching and thereby the convex shape 206a of the etching mask 206 is transferred to the inner lens material film 205 (see FIG. 14C). Thus, the inner lens 207 is derived. Thereafter, a flattened film (insulating film) is formed, and thereon a color filter layer or micro lenses are appropriately formed.

In the step of forming the above described inner lens, since each inner lens is formed on each photoelectric conversion element 110 of the sensor arrays 100, the inner lens forming film 205 is formed over the entire area of the sensor arrays 100 (photoelectric conversion area). In the vicinity of the outer peripheral portion of the inner lens forming film 205 (near the boundary to the area where no inner lens is formed), there is dispersion in conditions at the time of gas etching. Therefore, there is a case where the size and the dielectric constant of the inner lens formed in the vicinity of the outer peripheral portion may differ. For example, in the vicinity of the outer peripheral portion of the inner layer forming film 205, supply of etching gas will become uneven to give rise to dispersion in the size of the convex shape. In addition, the plasma density in the vicinity of the outer peripheral portion of the inner layer forming film 205 differs from that of the center part thereof. Thereby, the plasma damage in the vicinity of the outer peripheral portion will differ from that in the center part to give rise to dispersion in the dielectric constant. Thus if there exists dispersion in the size and the dielectric constant of the inner lenses, efficiency of condensing light to the photoelectric conversion element 110 (photodiode area 202) will differ on sites to give rise to dispersion in optical output and a drop of sensitivity.

Here, the problems with dispersion in optical output and a drop of sensitivity described above can be solved by expanding the range of forming the inner lens material film 205 so as to cause the inner lenses in the vicinity of the outer peripheral portion which will give rise to dispersion in the size and the dielectric constant of the inner lenses to depart from the photoelectric conversion area. Specifically, the range of forming the inner lens material film 205 is expanded from the photoelectric conversion area to the peripheral portions. The width to be expanded is 1 pixel or more, and more desirably around 5 to 10 pixels. According to this configuration, the inner lenses formed in the peripheral portions of the photoelectric conversion area are treated as only dummy inner lenses which have no object to condense lights, and therefore will not give any problem even if the size of the lens and the dielectric constant be in dispersion. In addition, in the photoelectric conversion area, the inner lenses having approximately the same size of lenses and dielectric constant can be formed and an objective light-condensing efficiency will become attainable. However, in this case, the problems as follows will arise.

Since in the MOS sensor shown in FIG. 13, the common output line 160 is normally provided in the peripheral portion of the photoelectric conversion area, there is a case where the dummy inner lenses are located immediately above or immediately below the common output lines. Here, the case where the dummy inner lenses are formed on the common output lines will be considered. FIG. 15 is a conceptual plan view of a CMOS aria sensor in case of forming dummy lenses on the common output lines and FIG. 16 is a schematic sectional view along the 16—16 line in FIG. 15.

With reference to FIG. 15, at both sides of the photoelectric conversion area 300 where the photoelectric conversion elements 110 of the sensor arrays 100 are formed, common output line forming areas 301a and 301b are arranged. In the common output line forming areas 301a and 301b, an S common output line Ch1s and an N common output line Ch1n respectively connected to inputs of an S-N reading circuit 150a and an S common output line Ch2s and an N common output line Ch2n respectively connected to both inputs of an S-N reading circuit 150b are respectively formed. The inner lens forming area 302 where the inner lenses and the dummy inner lenses are formed is formed over the range including the entire area of the photoelectric conversion area 300 and its peripheral area, and the outer peripheral portion of the inner lens forming area 302 overlaps with the areas 301a and 301b where the common output lines are formed.

As shown in FIG. 16, in the photoelectric conversion area 300, inner lenses 207 are formed immediately above the photodiode area 202. In the area other than the photoelectric conversion area 300, that is, in the dummy area, the dummy inner lenses 207a are formed in the same pitch as for the inner lenses 207, and in the area corresponding with the common output line forming area 301a, the wiring layers 208a and 208b respectively corresponding with the common output lines Ch1s and Ch1n are formed. Below the wiring layers 208a and 208b, further other wiring layers 209a and 209b are formed. Although not shown in FIG. 16, in the area corresponding with the common output line forming area 301a in the dummy area, wiring corresponding with the common output lines Ch2s and Ch2n is formed as well.

In case of the above described configuration, lines of electric force e as shown in FIG. 17 arise in the span to the wiring layers 208a and 208b. The pitch for the wiring layers 208a and 208b is set irrelevant to the pitch for the dummy inner lens 207a. Therefore, the area where a dummy inner lens 207a overlaps with the wiring layer 208a differs from the area where a dummy inner lens 207a overlaps with the wiring layer 208b. Thereby, the coupling capacitance (density of line of electric force e) arising between the wiring layer 208a and another wiring differs from the coupling capacitance (density of line of electric force e) arising between the wiring layer 208b and another wiring. The reason thereof is that lines of electric force are amplified by a dummy inner lens with a high dielectric constant and different pitch will result in a difference in amplifying percentage.

There is a case where the wiring layer 208a (common output line Ch1s) being the S-common output line corresponding with the signal component (S) differs from the wiring layer 208b (common output line Ch1n) being the N-common output line corresponding with the reset component (N) in coupling capacitance respectively corresponding with other wiring layers. Then, the noise level in the input of the S-N reading circuit 150a from the S-common output line will differ from that from the N-common output line. Therefore, the noise that has occurred in the S-common output line and the noise that has occurred in the N-common output line will become unable to be completely cancelled. Therefore, the output of the S-N reading circuit 150a will include noise. Likewise noise problems will arise also in the S-N reading circuit 150b.

The above described coupling capacitance will become a problem in a reading circuit other than the S-N reading circuit. Specifically, that is the case of having a reading circuit comprising a plurality of common output lines supplied with the signal component from each photoelectric conversion element (S) on a row-by-row basis and being configured so as to amplify the signal component (S) supplied to each common output line. In this case, when the above described coupling capacitance arises, the signal level outputted through each common output line will give rise to dispersion, consequently making it impossible to read the signal component correctly.

In addition, the above described coupling capacitance gives rise to attenuation of output of the reading circuit. Specifically, when coupling capacitance arises between the common output line and another wiring, capacitance Ch increases and consequently the capacitance division proportion (Ct/(Ct+Ch)) decreases so that the output of the S-N reading circuit (signal component (S)) attenuates. With attenuation of this output being large, correct reading of signal components (S) will become difficult and intensive sensitivity will not become retainable.

An object of the present invention is to solve the above described problems and to provide a solid state image pickup device capable of reading the signal components (S) correctly and an image pickup system with it.

SUMMARY OF THE INVENTION

In order to attain the above described object, the present invention is characterized by an image pick-up apparatus comprising:
a photoelectric conversion area comprising a plurality of pixels arranged at a semiconductor substrate,
a peripheral circuit area for reading a signal from the photoelectric conversion area,
a common output line arranged at the peripheral circuit area for transmitting the signal from the photoelectric conversion area,
a inner lens arranged on an insulating layer covering a layer comprising the common output line
a color filter arranged on the inner lens, and
a micro lens arranged on the color filter,
wherein the inner lens arranged not overlapped with the common output line and the color filter arranged on the peripheral circuit area.

Other features and advantages of the present invention will be apparent from the following description taken in conjunction with the accompanying drawings, in which like reference characters designate the same or similar parts throughout the figures thereof.

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENTS

Next, embodiments of the present invention will be described with reference to drawings.

(Embodiment 1)

Figure 1:
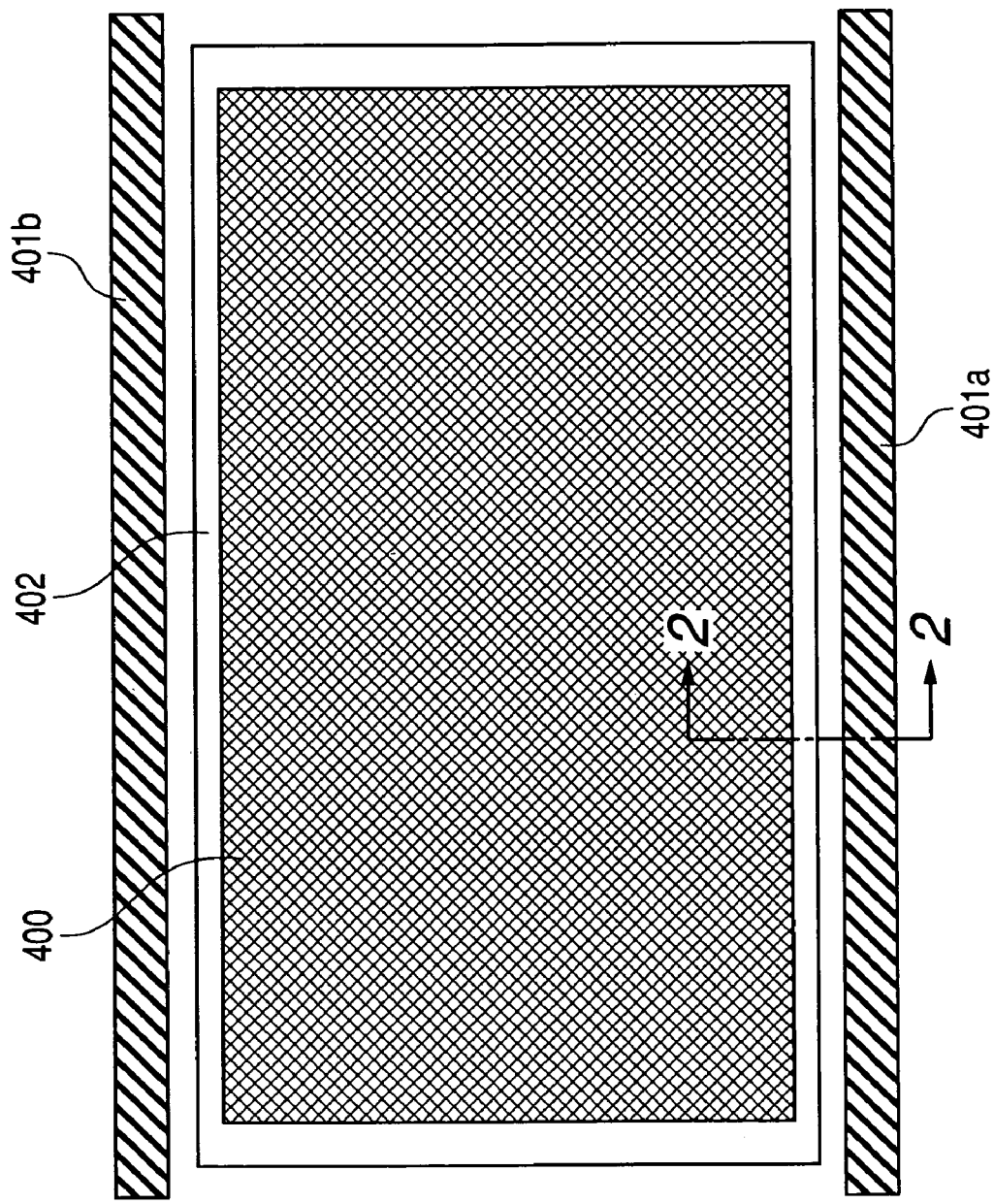
FIG. 1 is a conceptual plan view of solid state image pickup device being a first embodiment of the present invention.
Figure 2:
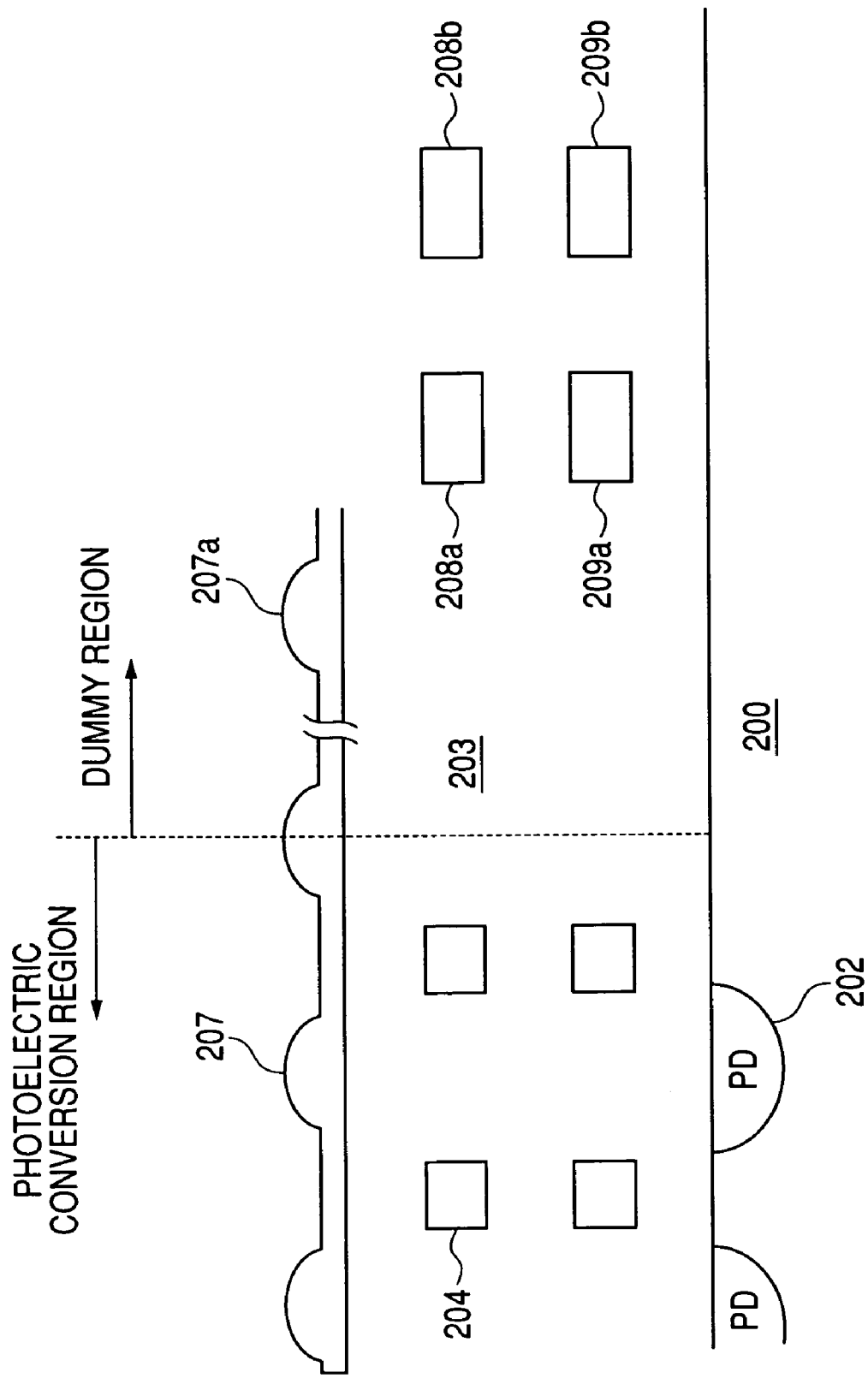
FIG. 2 is a schematic sectional view along the 2—2 line in FIG. 1.
Figure 3:
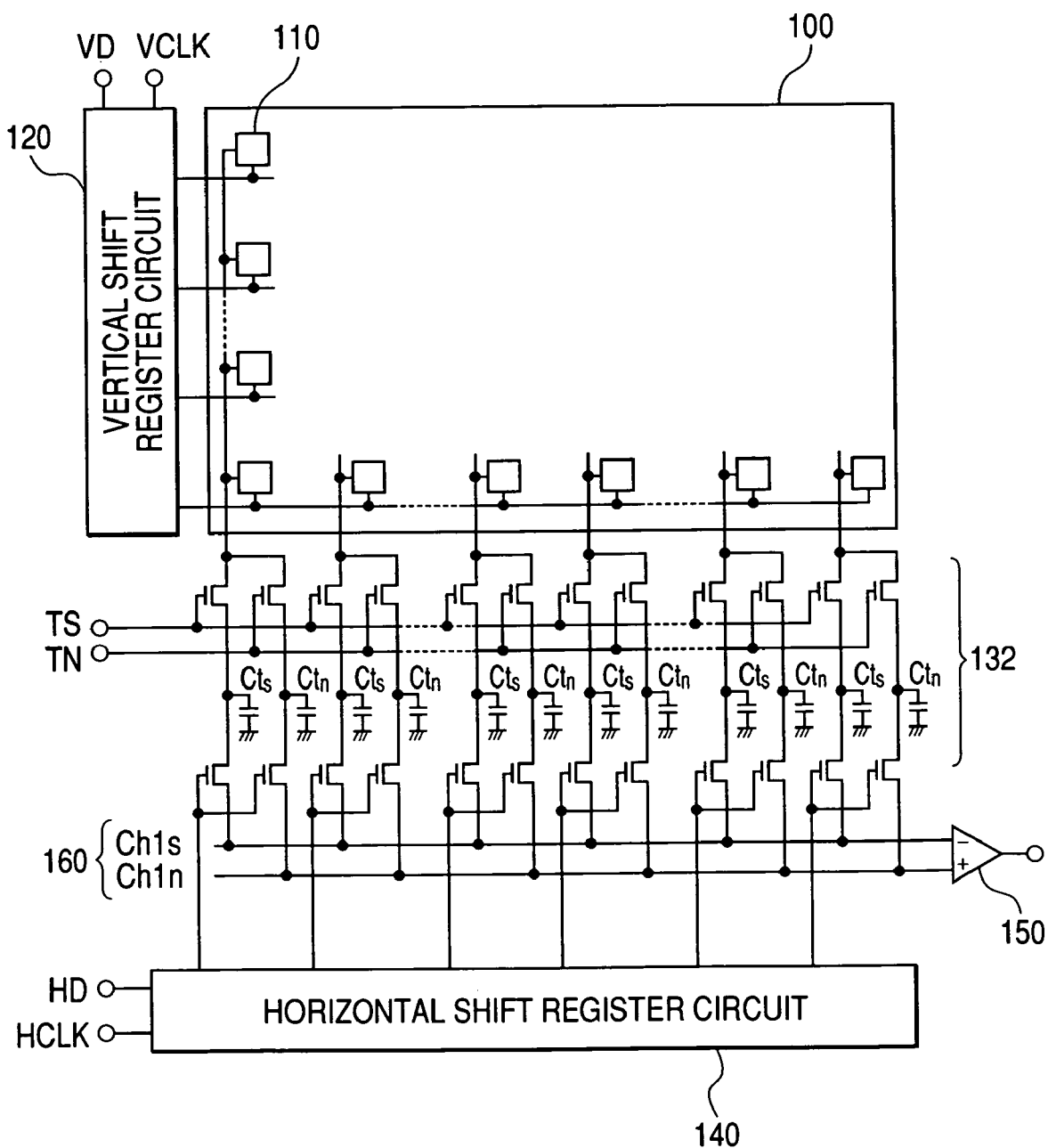
FIG. 3 is a schematic block diagram of a solid state image pickup device being the first embodiment of the present invention.

FIG. 1 is a conceptual plan view of solid state image pickup device being a first embodiment of the present invention and FIG. 2 is a schematic sectional view along the 2—2 line in FIG. 1. FIG. 3 is a schematic block diagram of a solid state image pickup device of the present embodiment.

Figure 13:
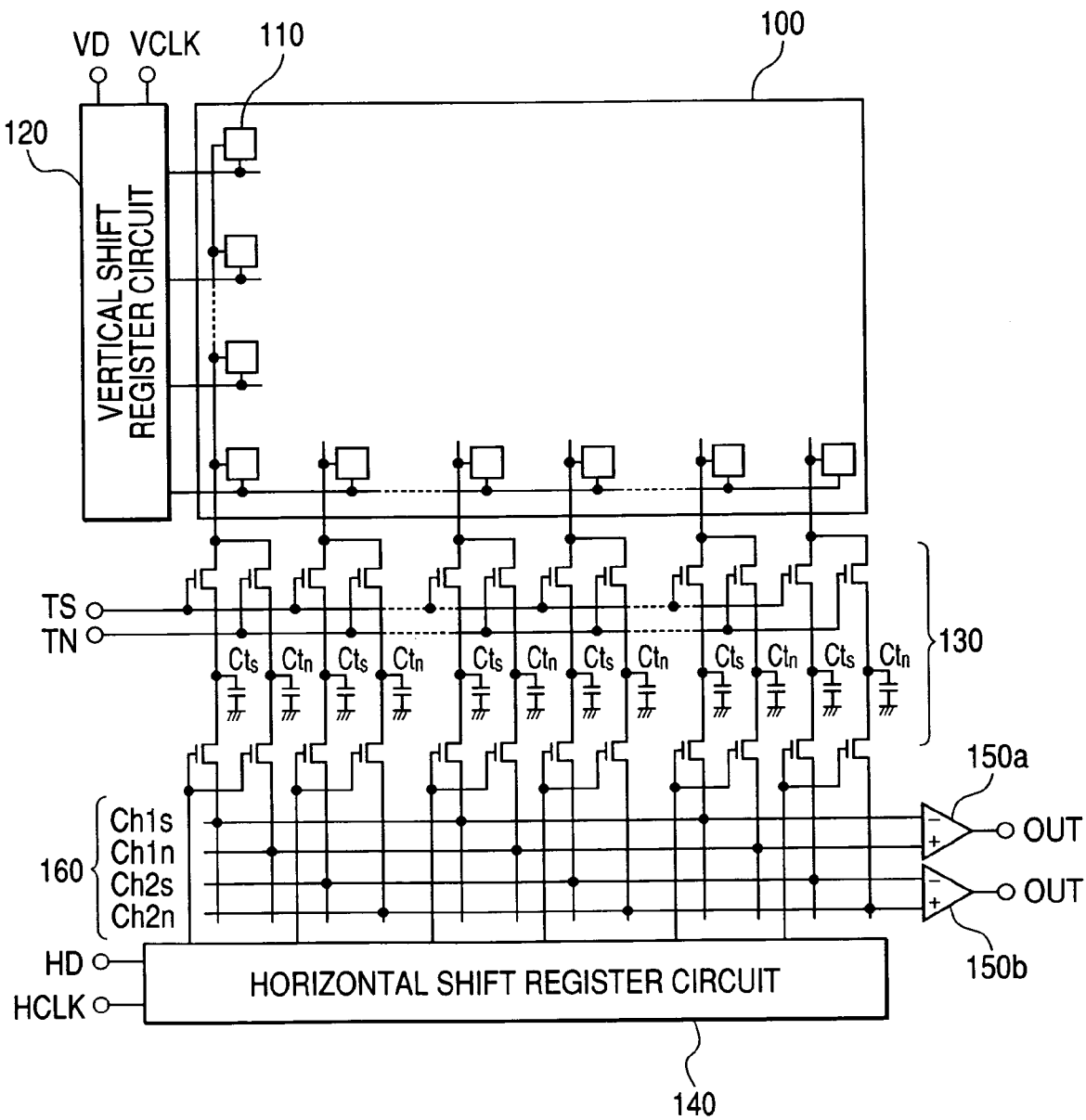
FIG. 13 is a block diagram showing an example of a MOS type sensor to which a solid state image pickup device comprising inner lenses.
Figure 14A:
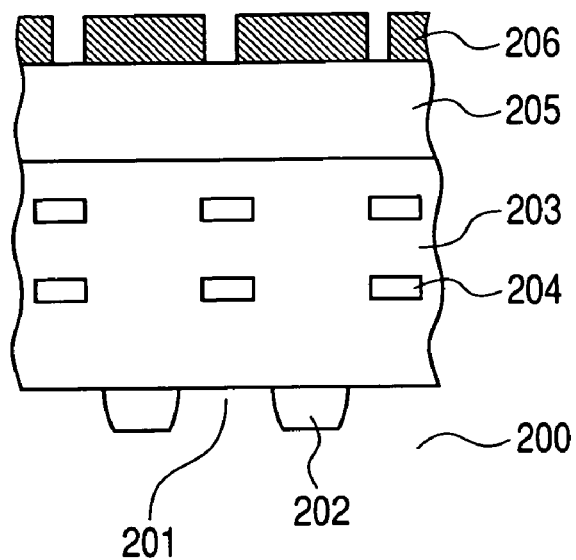
FIGS. 14A, 14B and 14C are stepwise sectional views for describing the procedure of forming inner lenses.
Figure 14B:
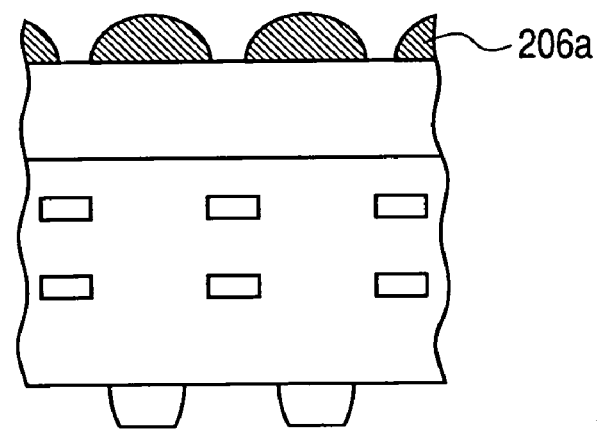
Figure 14C:
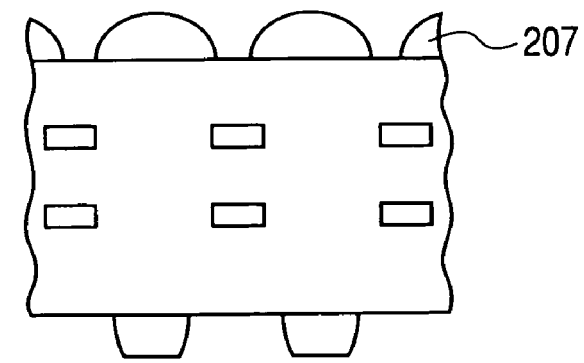
Figure 15:
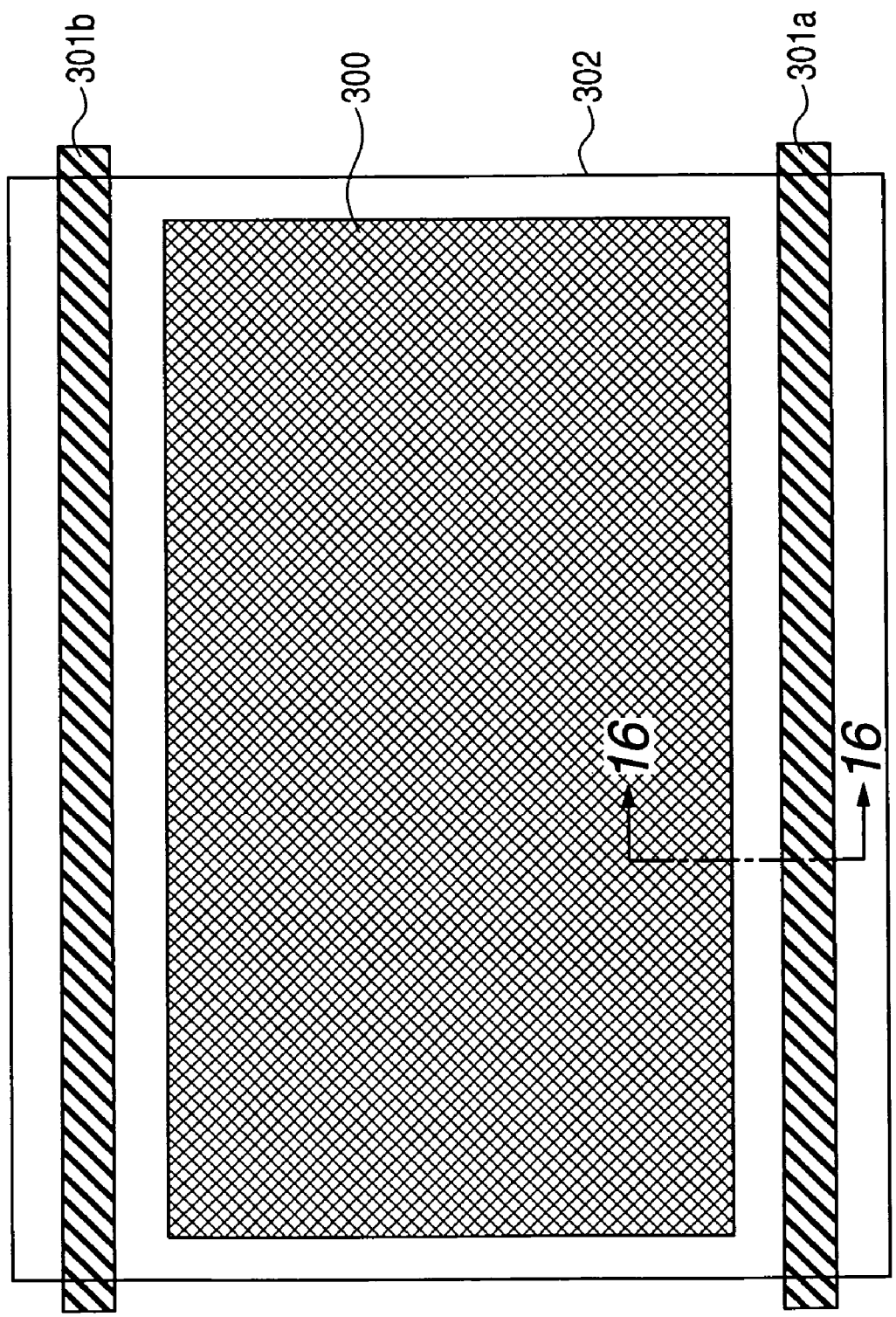
FIG. 15 is a conceptual plan view of a conventional CMOS area sensor in which dummy inner lenses are formed above common output lines.
Figure 16:
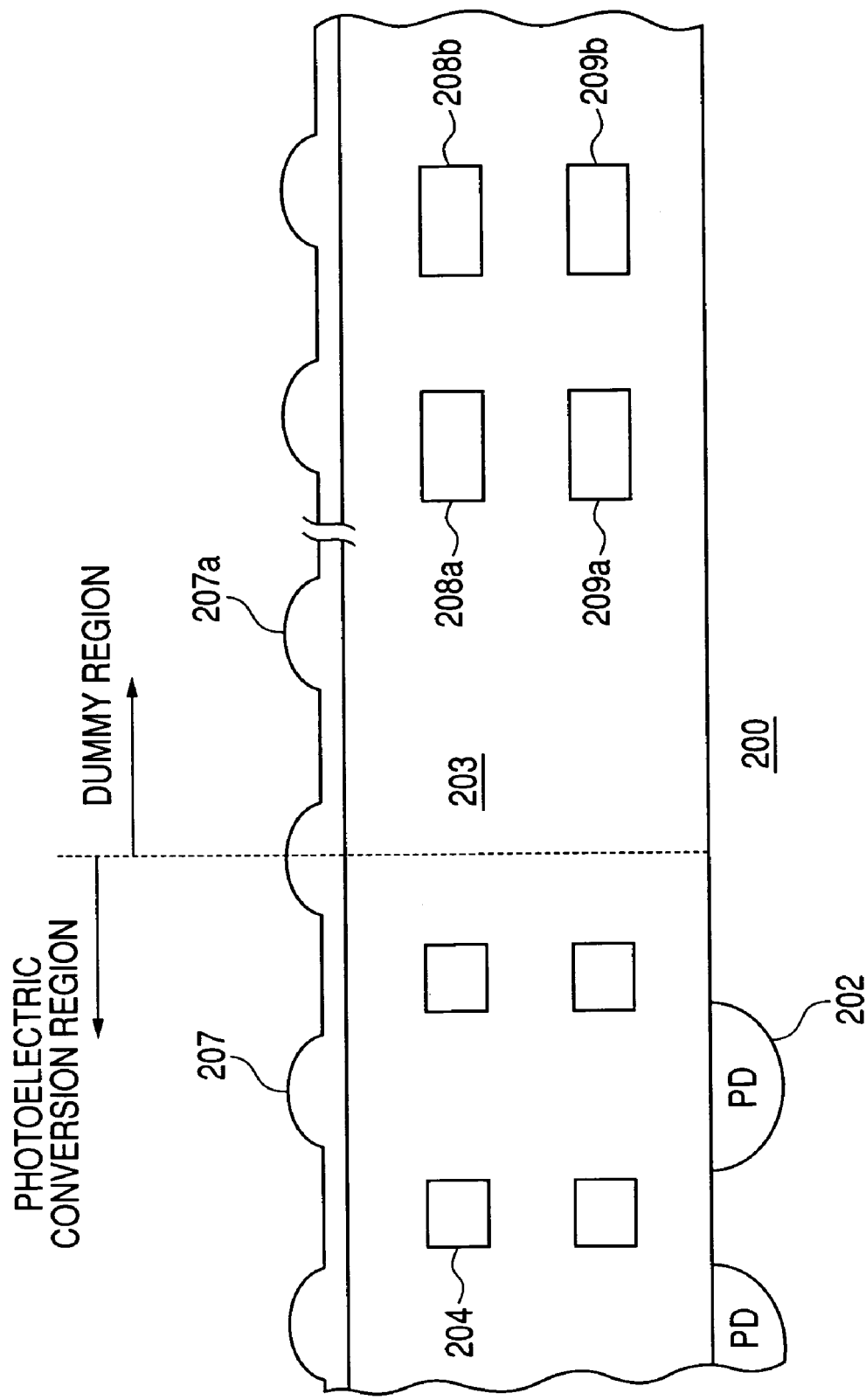
FIG. 16 is a schematic sectional view along the 16—16 line in FIG. 15.

The solid state image pickup device of the present embodiment is basically likewise the one shown in FIG. 13 other than the difference in portions of line memory circuits and reading circuits. In FIG. 3, like reference characters and numerals designate the same parts shown in FIG. 13.

The line memory circuits 132 include retaining capacitance Cts and retaining capacitance Ctn respectively retaining signal components (S) and reset components (N) of photoelectric conversion elements 110 selected with a vertical shift register circuit 120. A horizontal shift register circuit 140 selects a single piece of data at a time from the signal data in a line retained in the line memory circuits 130. An S-N reading circuit 150 amplifies and outputs difference between the signal-components (S) and the reset components (N) on the data selected with the horizontal shift register circuit 140.

To one input terminal of the S-N reading circuit 150, an S-common output line Ch1s is connected and, to the other input terminal, an N-common output line Ch1n is connected. To the S-common output line Ch1s, lines including the retaining capacitance Cts of the photoelectric conversion elements 110 on each row are connected commonly. To the N-common output line Ch1n, lines including the retaining capacitance Ctn of the photoelectric conversion elements 110 on each row are connected commonly.

In the solid state image pickup device of the present embodiment, inner lenses in the vicinity of an outer periphery portion which will give rise to dispersion in the size and the dielectric constant are formed as dummy inner lenses in the peripheral portions of the photoelectric conversion area of the sensor arrays 100. Moreover, those dummy inner lenses are not to overlap with the common output lines 160. The specific structures will be described with reference to FIGS. 1 to 3 below.

As shown in FIG. 1, at both sides of the photoelectric conversion area 400 where the photoelectric conversion elements 110 of the sensor arrays 100 are formed, common output line forming areas 401a and 401b are arranged. Spacing between respective each of the common output line forming areas 401a and 401b and the photoelectric conversion area 400 differs based on design conditions, but is generally in the order of ten to several hundred μm. In the common output line forming areas 401 and 401b, an S-common output line Ch1s and an N-common output line Ch1n which are respectively connected to input terminals of an S-N reading circuit 150 are respectively formed.

In the inner lens forming area 402, inner lenses are formed in the same pitch (same as pixel pitch). The size of an inner lens is normally in the order of 1 to 10 μm. The inner lens forming area 402 covers the range including the entire area of the photoelectric conversion area 400 and its peripheral area. However, the area will not overlap with the common output line forming areas 401a and 401b. The inner lenses formed on the peripheral area are dummy inner lenses.

As shown in FIG. 2, in the photoelectric conversion area 400, inner lenses 207 are formed immediately above the photodiode area 202. In the area other than the photoelectric conversion area 400, that is, in the dummy area, the dummy inner lenses 207a are formed in the same pitch as for the inner lenses 207. And, in the area corresponding with the common output line forming area 401a, the wiring layers 208a and 208b respectively corresponding with the common output lines Ch1s and Ch1n are formed. Below the wiring layers 208a and 208b, further other wiring layers 209a and 209b are formed.

According to the above described structure, the dummy inner lenses 207a are not to overlap with the wiring layers 208a and 208b, giving rise to, therefore, no dispersion in coupling capacitance arising between the wiring layers 208a and 208b and the other wiring. Therefore, difference in noise in the inputs of the S-N reading circuit 150 will become small with the S-common output line and with the N-common output line, making it possible to suitably cancel the noise that has occurred in the S-common output line and the noise that has occurred in the N-common output line. Accordingly, in the output terminal of the S-N reading circuit 150, signals can be efficiently derived among signals and noise (reset components) that have arisen with the photoelectric conversion elements 110, and correct S-N reading can be implemented. Here, "not overlap" refers to such a state where the projection of inner lenses does not overlap with the common output line in the case where the inner lenses and the common output line are projected to the same plane as the plane where the common output line is arranged from the direction perpendicular to the above described plane. As shown in FIG. 2, in a sectional view, it refers to such a state where an inner lens 207a does not overlap with the common output line in the case where the lens has been caused to move in perpendicular to the plane where the common output line is arranged. The perpendicular positioning relationship between the inner lenses and the common output lines may be reversed. Also in the following embodiments, "not overlap" refers to such a state.

Here, when coupling capacitance having been amplified by the dummy inner lenses 207a arises between the common output line and another wiring, capacitance Ch increases and consequently the capacitance division proportion (Ct/(Ct+Ch)) decreases so that the output of the S-N reading circuit 150 (signal component (S)) attenuates. In the present embodiments, since the coupling capacitance is not amplified by the inner lenses and thus such attenuation of signal charge (S) does not arise, high sensitivity can be retained.

(Embodiment 2)

A solid state image pickup device being a second embodiment of the present invention has wiring layers 209a and 209b being the common output lines Ch1s and Ch1n respectively instead of the wiring layers 208a and 208b in the structure shown in FIG. 2. In addition, the layer where the inner lenses 207 and the dummy inner lenses 207a are formed is formed to be located between the layer (first wiring layer) including the wiring layers 208a and 208b and the layer (second wiring layer) including the wiring layers 209a and 209b. Thereby, the dummy inner lenses 207a are characterized to be formed so as not to overlap with the wiring layers 209a and 209b. In this case, the first wiring layer may be used as a shielding film outside the photoelectric conversion area. Also this structure gives rise to likewise advantages such as the above described correct S-N reading as well as retaining of high sensitivity.

Figure 4:
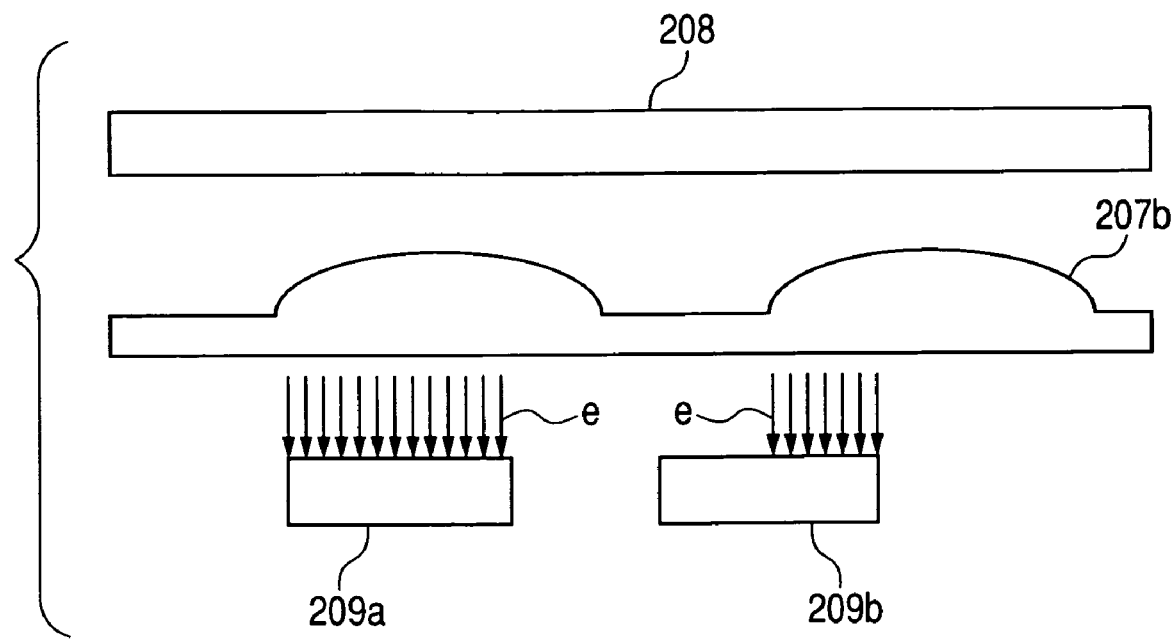
FIG. 4 is a schematic diagram showing coupled capacitance in a comparative example of a solid state image pickup device being a second embodiment of the present invention.

In order to make advantages of the solid state image pickup device of the present embodiment more comprehensible, as a comparative example, FIG. 4 schematically shows coupling capacitance arising between the common output lines and the other wiring in the case where the second wiring layer is the common output line and the dummy inner lenses are arranged above the common output line. In FIG. 4, the wiring layers 209a and 209b being the second wiring layers are the same as shown in FIG. 2. In the comparative example, the dummy inner lenses 207b are formed so as to overlap with these wiring layers 209a and 209b, and moreover, in the upper layer of those dummy inner lenses 207b, the wiring layer 208 as the first wiring layer is present. In addition, an insulating layer is present between the first wiring layer, the dummy inner lenses 207b and the second wiring layer respectively.

In the structure shown in FIG. 4, the pitch for the wiring layers 209a and 209b is set irrelevant to the pitch for the dummy inner lenses 207b. Therefore, the area where a dummy inner lens 207b overlaps with the wiring layer 209a differs from the area where a dummy inner lens 207b overlaps with the wiring layer 209b. Thereby, the coupling capacitance (density of lines of electric force e) arising between the wiring layer 209a and another wiring will differ from the coupling capacitance (density of lines of electric force e) arising between the wiring layer 209b and another wiring. Consequently, there is a case where the S-common output line (wiring layer 209a) will differ from the N-common output line (wiring layer 209b) in the level of noise in the input of the S-N reading circuit and noise will remain.

In contrast herewith, in the solid state image pickup device of the present embodiment, since dummy inner lenses will not overlap with the wiring layers 209a and 209b, coupling capacitance will never be influenced by the dummy inner lenses in the S-common output line and the N-common output line.

Accordingly, it is possible to implement correct S-N reading.

(Embodiment 3)

Figure 5:
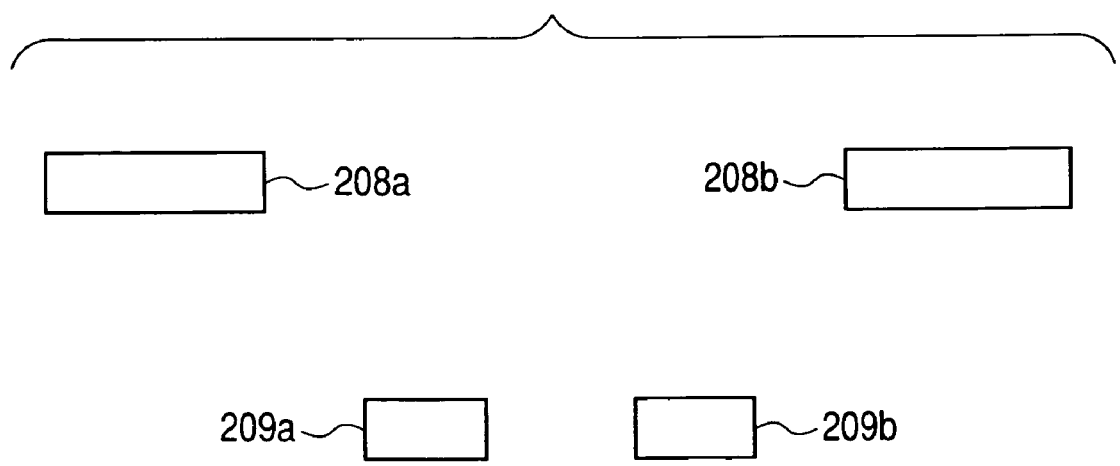
FIG. 5 is a sectional diagram in the vicinity of common output lines of a solid state image pickup device being a third embodiment of the present invention.

FIG. 5 is a sectional diagram in the vicinity of common output lines of a solid state image pickup device being the third embodiment of the present invention. This solid state image pickup device has wiring layers 209a and 209b being the second wiring layer to become the common output lines Ch1s and Ch1n respectively instead of the wiring layers 208a and 208b being the first wiring layer in the structure shown in FIG. 2 and is structured so that the wiring layers 209a and 209b will not overlap with the wiring layers 208a and 208b located there above (a structure that the first wiring layer is structured to open immediately above the wiring layers 209a and 209b). Also this structure gives rise to likewise advantages such as the above described correct S-N reading as well as retaining of high sensitivity.

Figure 6:
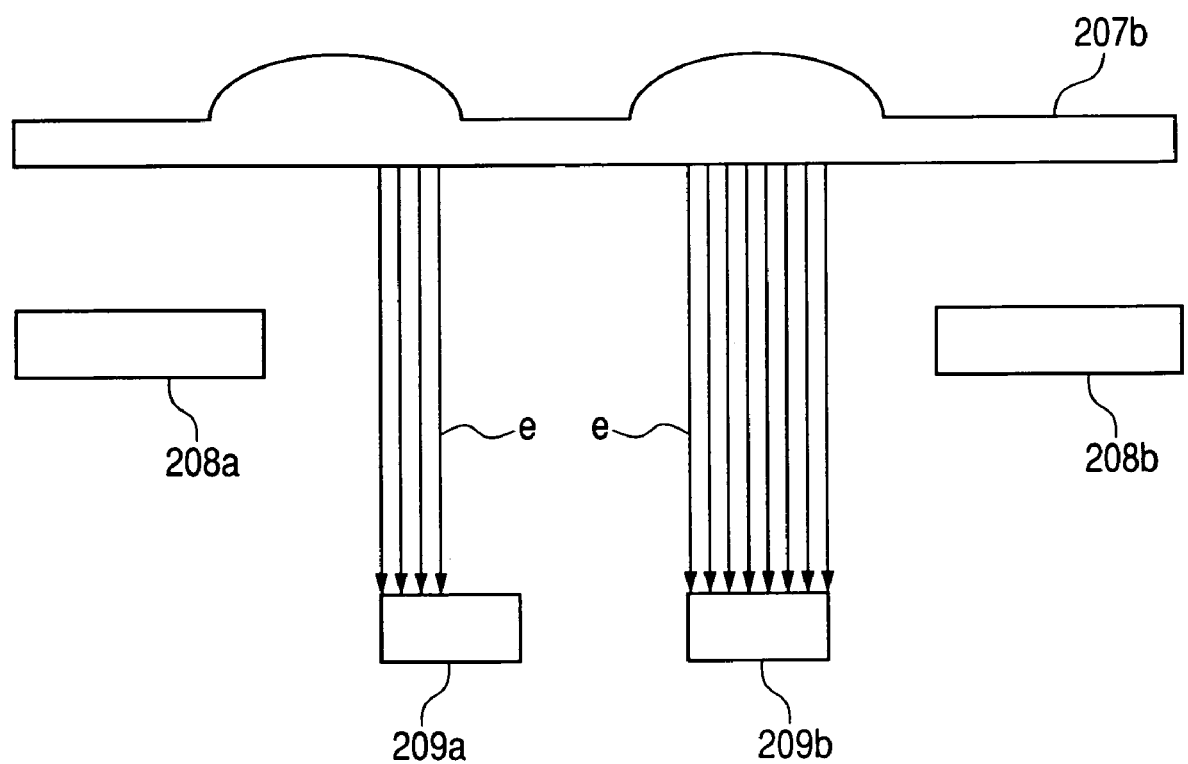
FIG. 6 is a schematic diagram showing coupled capacitance in a comparative example of a solid state image pickup device being the third embodiment of the present invention.

In order to make advantages of the solid state image pickup device of the present embodiment more comprehensible, as a comparative example, FIG. 6 schematically shows lines of electric force arising between the common output lines and the other wiring in the case where the second wiring layer is the common output line and the dummy inner lenses are arranged above the common output line. In FIG. 6, the wiring layers 208a and 208b being the first wiring layers and the wiring layers 209a and 209b being the second wiring layers are the same as shown in FIG. 5. In the comparative example, the dummy inner lenses 207b are formed in the upper layer of the first wiring layer so as to overlap with the wiring layers 209a and 209b. In addition, insulating layers are present between the first wiring layer, the dummy inner lenses 207b and the second wiring layer respectively.

In the structure shown in FIG. 6, the pitch for the wiring layers 209a and 209b is set irrelevant to the pitch for the dummy inner lenses 207b. Therefore, the area where a dummy inner lens 207b overlaps with the wiring layer 209a differs from the area where a dummy inner lens 207b overlaps with the wiring layer 209b. Thereby, the coupling capacitance (density of lines of electric force e) arising between the wiring layer 209a and another wiring differs from the coupling capacitance (density of lines of electric force e) arising between the wiring layer 209b and another wiring. Consequently, the S-common output line (wiring layer 209a) will differ from the N-common output line (wiring layer 209b) in the level of noise in the input of the S-N reading circuit and it will become impossible to completely cancel that noise.

In contrast herewith, in the solid state image pickup device of the present embodiment, since dummy inner lenses will not overlap with the wiring layers 209a and 209b, coupling capacitance will never be influenced by the dummy inner lenses in the S-common output line and the N-common output line.

Accordingly, it is possible to implement correct S-N reading.

(Embodiment 4)

Figure 7:
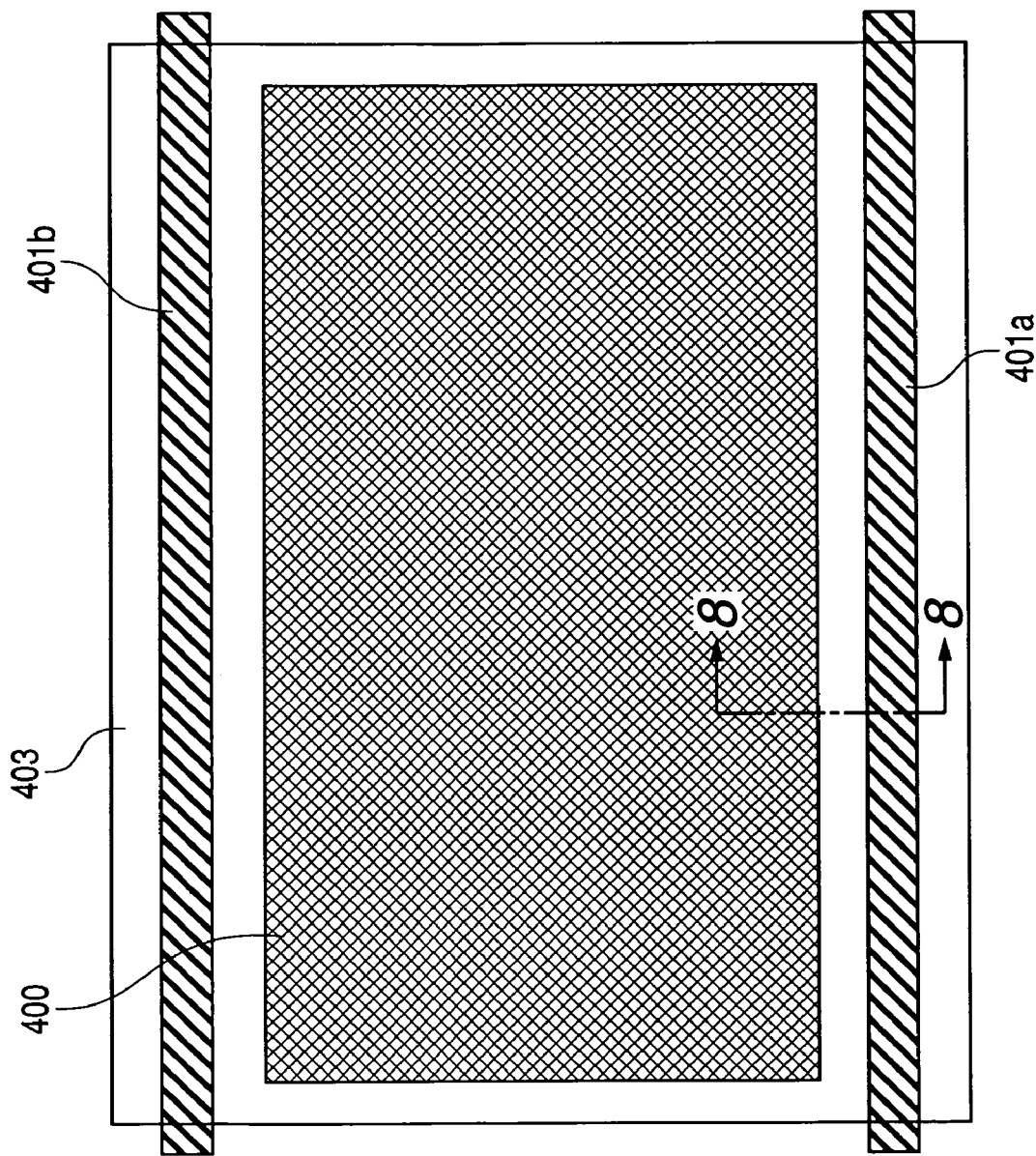
FIG. 7 is a conceptual plan view of solid state image pickup device being a fourth embodiment of the present invention.
Figure 8:
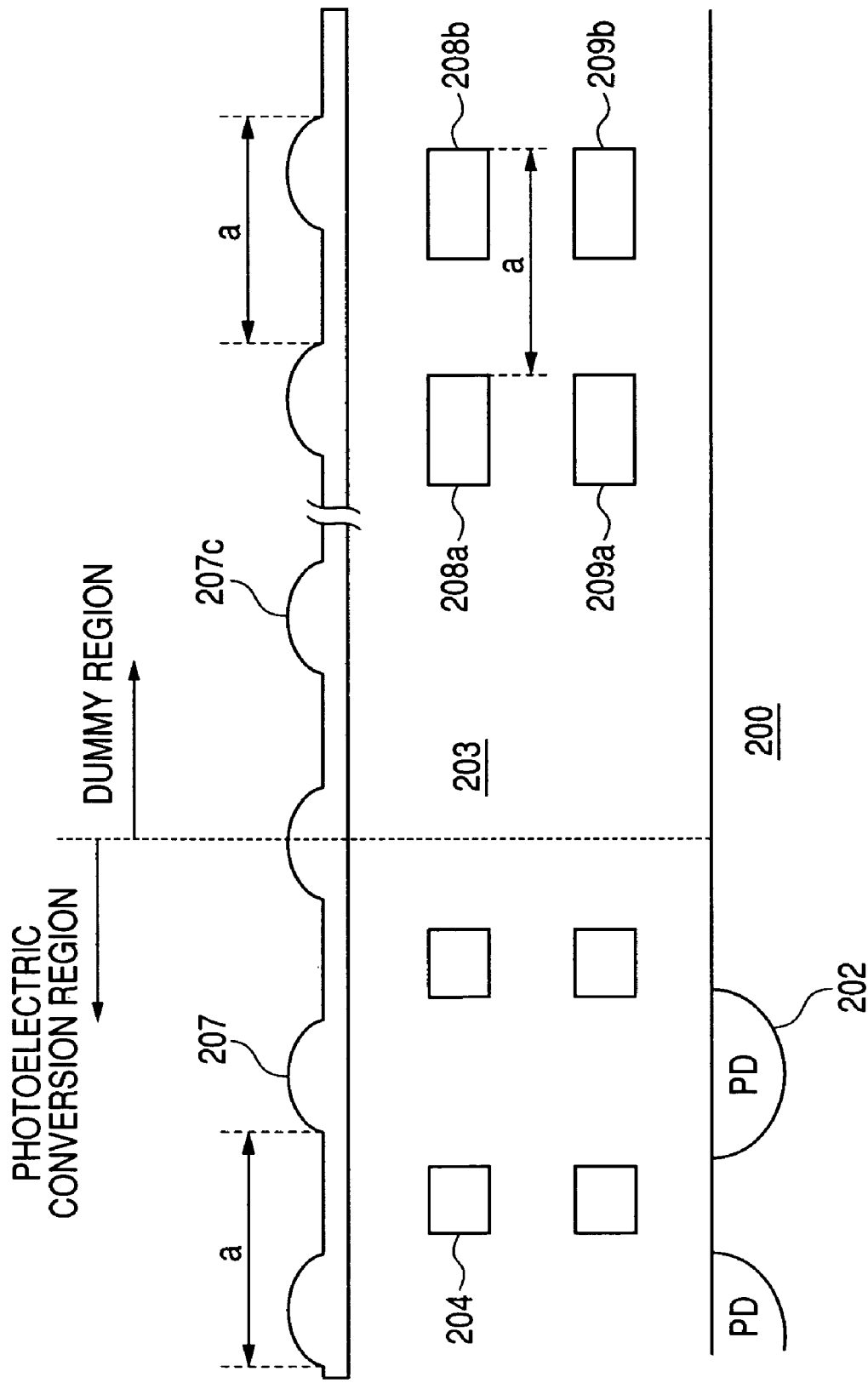
FIG. 8 is a schematic sectional view along the 8—8 line in FIG. 7.

FIG. 7 is a conceptual plan view of solid state image pickup device being a fourth embodiment of the present invention and FIG. 8 is a schematic sectional view along the 8—8 line in FIG. 7.

In the solid state image pickup device of the present embodiment, which is to be applied to the circuit configuration shown in FIG. 3, inner lenses in the vicinity of an outer periphery portion which will give rise to dispersion in the size of the lenses and the dielectric constant are formed as dummy inner lenses in the peripheral portions of the photoelectric conversion area of the sensor arrays 100. And those dummy inner lenses overlap with the common output lines 160. A specific structure thereof will be described with reference to FIG. 3, FIG. 7 and FIG. 8 as follows.

As shown in FIG. 7, at both sides of the photoelectric conversion area 400 where the photoelectric conversion elements 110 of the sensor arrays 100 are formed, common output line forming areas 401a and 401b are arranged. In the common output line forming areas 401 and 401b, an S-common output line Ch1s and an N-common output line Ch1n which are respectively connected to input terminals of an S-N reading circuit 150 are respectively formed.

In the inner lens forming area 403, inner lenses are formed in the same pitch (same as pixel pitch). The size of an inner lens is normally in the order of 1 to 10 μm. The inner lens forming area 403 covers the range including the entire area of the photoelectric conversion area 400 and its periphery area, and overlaps with the common output line forming areas 401a and 401b. The inner lenses formed on the peripheral area are dummy inner lenses.

As shown in FIG. 8, in the photoelectric conversion area 400, inner lenses 207 are formed immediately above the photodiode area 202 in a constant pitch a (corresponding with the pitch for the photodiode area 202). In the dummy area of the peripheral portion of the photoelectric conversion area 400, the dummy inner lenses 207c are formed in the same pitch a as for the inner lenses 207. In the area corresponding with the common output line forming area 401a, the wiring layers 208a and 208b respectively corresponding with the common output lines Ch1s and Ch1n are, formed in the same pitch a as for the inner lenses 207c. Below the wiring layers 208a and 208b, further other wiring layers 209a and 209b are formed.

According to the above described structure, the dummy inner lenses 207c are to overlap with the wiring layers 208a and 208b. Since the pitch for the dummy inner lenses 207c and the pitch for the wiring layers 208a and 208b are the same, the area where a dummy inner lens 207c overlaps with the wiring layer 208b will be the same as the area where a dummy inner lens 207c overlaps with the wiring layer 208a. Therefore, the level of noise in the input of the S-N reading circuit 150 will be the same as for the S-common output line and for the N-common output line, making it possible to suitably cancel the noise that has occurred in the S-common output line and the noise that has occurred in the N-common output line. Accordingly, in the output terminal of the S-N reading circuit 150, signals can be efficiently derived among signals and noise that has arisen with the photoelectric conversion elements 110, and correct S-N reading can be implemented.

Here, as described in the problems, in the vicinity of the outer peripheral portion of the inner lens forming area 403, dispersion in conditions at the time of gas etching gives rise to difference in the size of the inner lenses and dielectric constant. Therefore, when inner lenses (dummy inner lenses) which gives rise to difference in such a size and dielectric constant have been formed above the common output lines, the area where a dummy inner lens 207c overlaps with the wiring layer 208a will differ from the area where a dummy inner lens 207c overlaps with the wiring layer 208a. Thereby it will become impossible to implement correct S-N reading as described above. In order to reduce this, it is necessary to give sufficient allowance to the inner lens forming area 403 so that the inner lenses arising difference in size and dielectric constant are located further outside the common output line forming areas 401a and 401b. The spacing from both side portions of the common output line forming areas 401a and 401b to the edge of the inner lens forming area 403 is not less than 1 pixel and more desirably around 5 to 10 pixels.

(Embodiment 5)

The solid state image pickup device being a fifth embodiment of the present invention is characterized in that, in the structure shown in FIG. 8, wiring layers 209a and 209b are used as common output lines Ch1s and Ch1n instead of the wiring layers 208a and 208b, and moreover, layers where inner lenses 207 and dummy inner lenses 207c are formed have been formed so as to be located between the layer (first wiring layer) including the wiring layers 208a and 208b and the layer (second wiring layer) including the wiring layers 209a and 209b. In this case, the first wiring layer may be used as a shielding film outside the photoelectric conversion area. Also with this structure, correct S-N reading as in the case of the fourth embodiment can be implemented.

(Embodiment 6)

Figure 9:
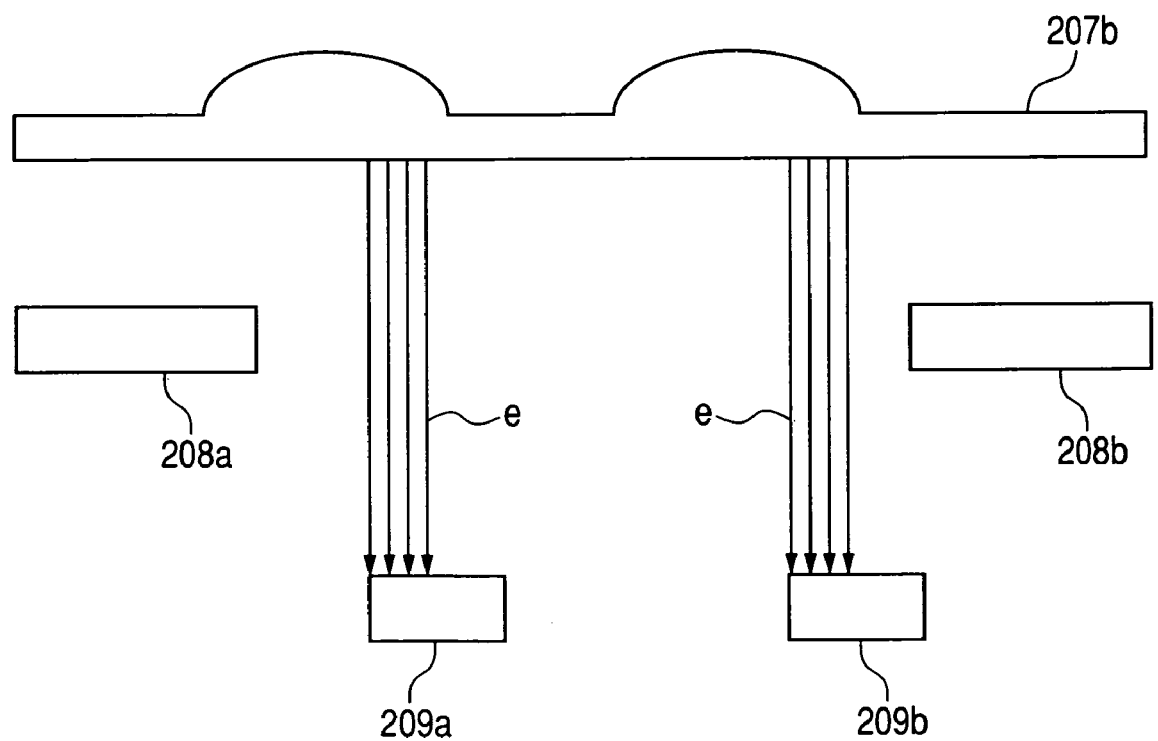
FIG. 9 is a sectional diagram in the vicinity of common output lines of a solid state image pickup device being a sixth embodiment of the present invention.

FIG. 9 is a sectional diagram in the vicinity of common output lines of a solid state image pickup device being a sixth embodiment of the present invention. This solid state image pickup device has wiring layers 209a and 209b being the second wiring layer to become the common output lines Ch1s and Ch1n respectively instead of the wiring layers 208a and 208b being the first wiring layer in the structure shown in FIG. 8 and is structured so that the wiring layers 209a and 209b will not overlap with the wiring layers 208a and 208b located there above (a structure that the first wiring layer is structured to open immediately above the wiring layers 209a and 209b). Also with this structure, correct S-N reading as in the case of the fourth embodiment can be implemented.

(Embodiment 7)

Figure 18:
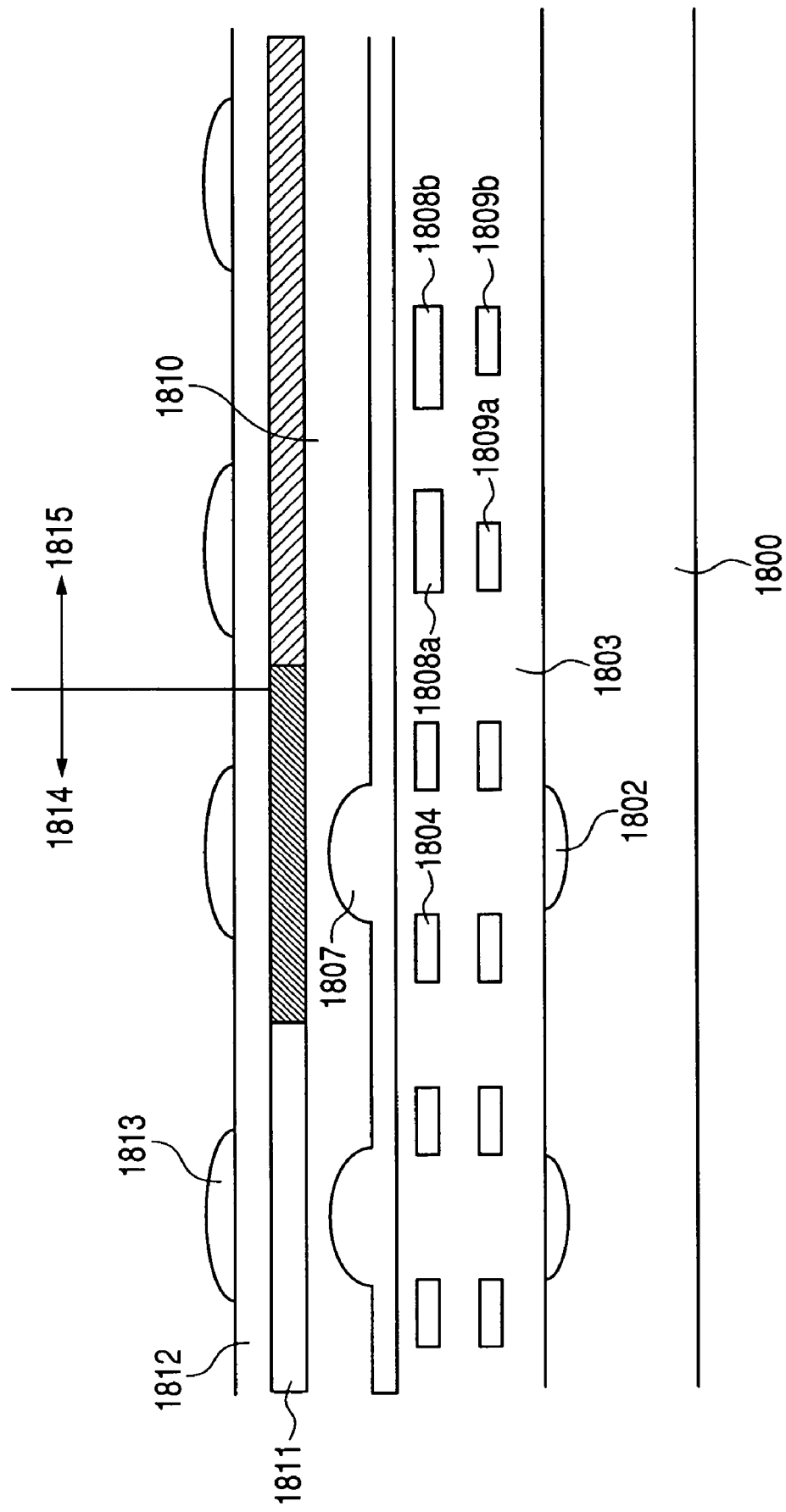
FIG. 18 is a schematic diagram of a solid state image pickup device being a seventh embodiment of the present invention.

FIG. 18 is a sectional view of an image pickup device of a seventh embodiment of the present invention. In the present embodiment, arrangement of a layer including inner lenses, a color filter layer and a micro lens layer will be described.

Reference numeral 1800 denotes a semiconductor substrate in which a photoelectric conversion unit has been arranged and reference numeral 1802 denotes a photoelectric conversion unit. The photoelectric conversion unit, for example, is a photodiode configured by including a P-type semiconductor area and an N-type semiconductor area. In addition, a configuration of amplifying type having an amplifying element each pixel and a plurality of pixels can be taken.

Reference numeral 1803 denotes an inter-layer film for implementing insulation between a semiconductor substrate and a wiring or between wirings with each other. Reference numeral 1804 denotes a wiring arranged in a pixel area.

Reference numeral 1807 denotes an inner lens. This inner lens is provided corresponding with the photoelectric conversion unit in the pixel area and is arranged above the layer including the common output lines via an insulating layer.

Reference numerals 1808a and 1808b denote common output lines. One functions as an S-common output line of transmitting signals corresponding with signal components and the other as an N-common output line. Reference numerals 1808a and 1808b denote wirings, which are used as wiring to drive MOS transistors which are arranged, for example, in the peripheral circuit area. Reference numeral 1810 denotes a flattened film, reference numeral 1811 denotes a color filter, reference numeral 1812 denotes a flattened film and reference numeral 1813 denotes a micro lens. Reference numeral 1814 denotes a pixel area and reference numeral 1815 denotes a peripheral circuit area for reading signals from the pixel area.

Here, a lens material layer for forming inner lenses is arranged above the peripheral circuit area as well, and is configured to shape, in the pixel area, lenses in a convex shape to incident lights with the above described forming method. The peripheral circuit area is thinner than the film thickness of inner lenses (lens height) with the etching step subject to processing of the above described resist to a lens shape at the time of forming inner lenses. This film thickness is thinned simultaneously with etching at the time of processing into a lens shape, and therefore is thickness substantially equal to the lens material layer arranged in the periphery of the inner lenses in the pixel area.

Figure 17:
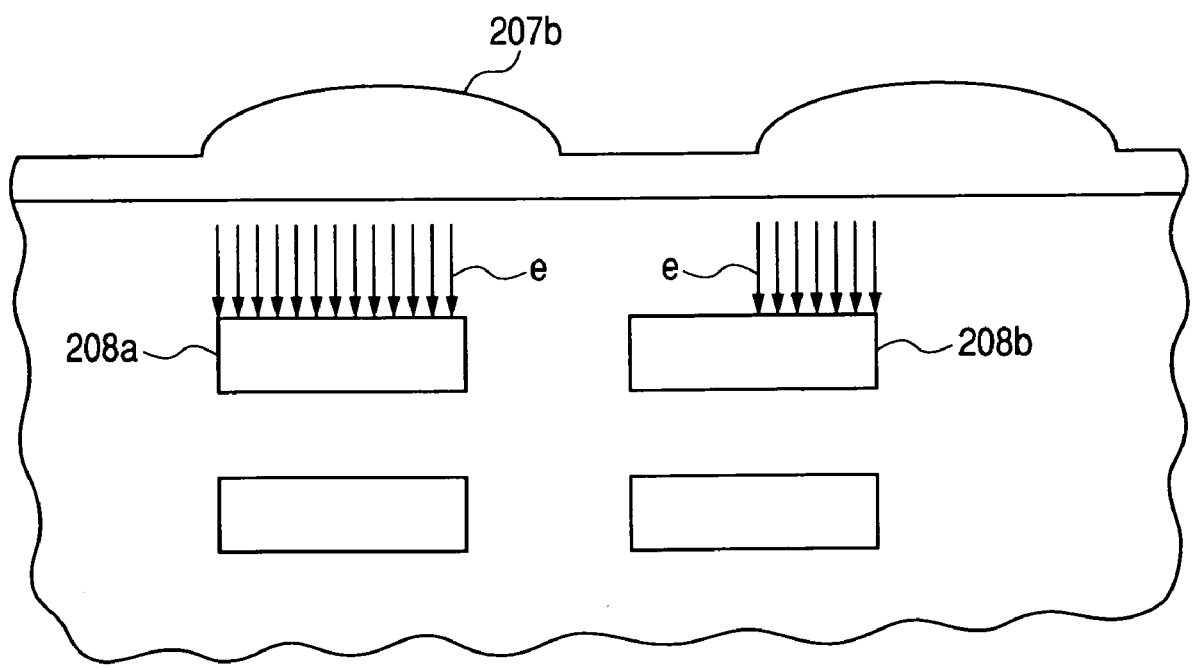
FIG. 17 is a model diagram showing coupling capacitance in a solid state image pickup device comprising inner lenses.

In a color filter each color is arranged to a pixel area corresponding with each photoelectric conversion unit. In addition, also in the peripheral circuit area, color filters are arranged as dummy patterns. In FIG. 17, the dummy pattern is configured by one color, but can be configured with a plurality of colors. With the color filter having the dummy patterns above the peripheral circuit area, the run of micro lens patterns is reduced in the area near and adjacent to the peripheral circuit area of the pixel area, and it will be possible to derive optical characteristics even at the end of the pixel area as in the vicinity of the center. In addition, also micro lenses are likewise arranged as dummy patterns in the peripheral circuit area. Also for the inner lenses, arrangement of dummy patterns is considered as in the pixel area, but influences, as described above, dispersion of capacitance between the common output lines with each other or between a common output line and the other wiring, and therefore, in the peripheral circuit area, the lens material layer having substantially uniform film thickness is left, but does not undergo processing into a lens shape. In addition, leaving the lens material layer with such substantially uniform film thickness, it will become possible to thin the film thickness of the flattened film to be formed afterwards so that the color filter and the micro lens dummy pattern can be suitably formed.

Here, any of the above described first to seventh embodiments was described by exemplifying the case of application to the circuit configuration shown in FIG. 3, but can be applied to the other circuit configurations. For example, the structure of each embodiment can be also applied to a configuration of an S-N reading circuit as shown in FIG. 13 in which a plurality of S-common output lines and a plurality of N-common output lines are present. In this case, in the common output line forming areas 401a and 401b, wiring layers respectively corresponding with a plurality of S-common output lines and a plurality of N-common output lines are formed. The case where the structure of the first to third and the seventh embodiments is applied gives rise to likewise advantages such as the above described correct S-N reading as well as retaining of high sensitivity by making the dummy inner lenses not overlap with any of wiring layers of common output lines. In addition, such an advantage that dispersion among respective common output lines in outputs (dispersion in inter-channel outputs) is also reduced is given rise to. The case where the structure of the fourth to sixth embodiments was applied gives rise to an advantage of correct S-N reading by setting the pitch for the dummy inner lenses and the pitch for wiring layers of respective common output lines to the same, and gives rise to an advantage that dispersion in inter-channel outputs can be reduced.

Figure 10:
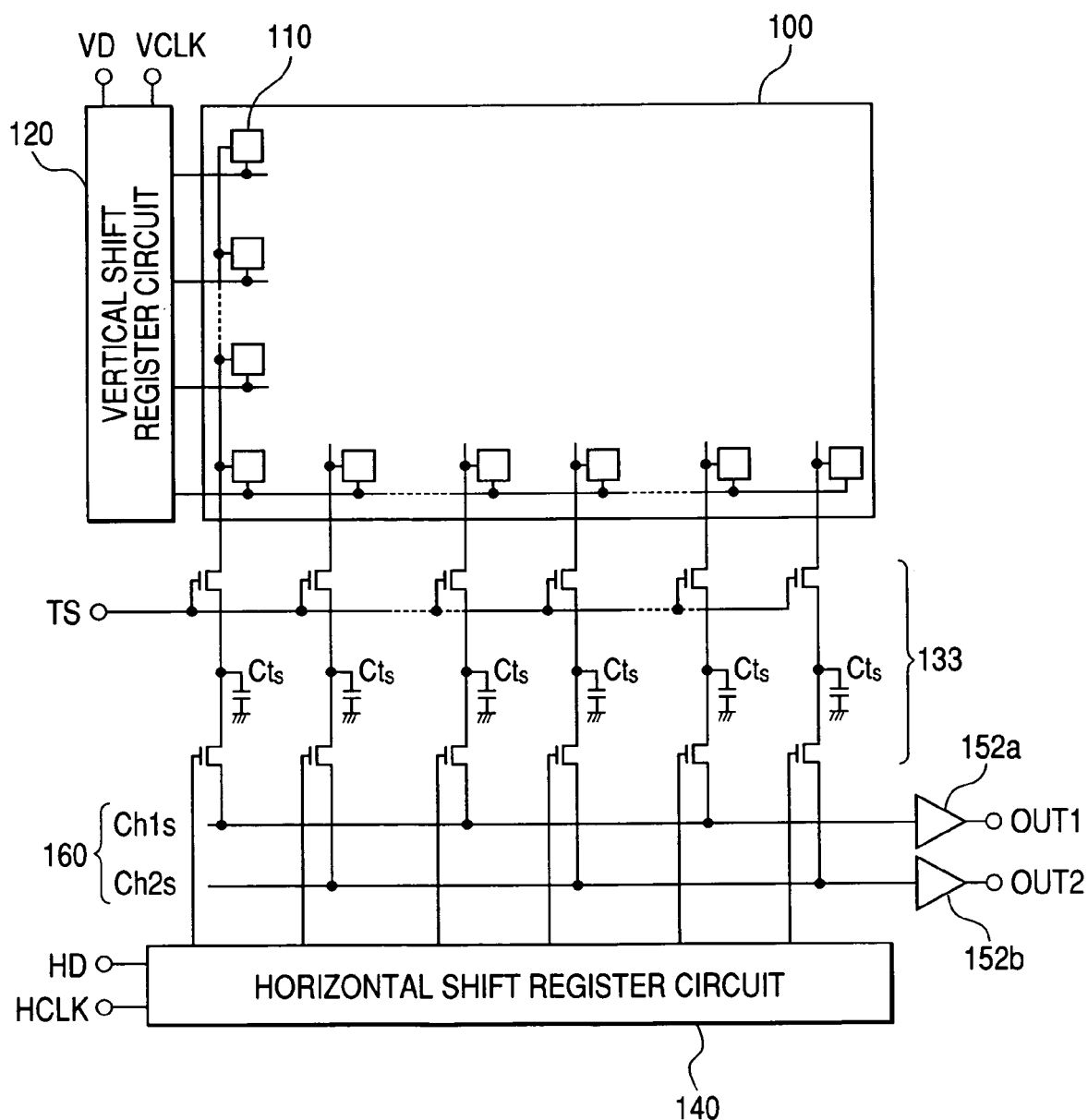
FIG. 10 is a block diagram showing an example of a circuit configuration to which the structure of the solid state image pickup device of the present invention is applicable.

Moreover, the first to seventh embodiments can be applied to such a configuration that does not have any S-N reading circuit as shown in FIG. 10. This circuit is a MOS-type sensor, which is basically likewise the one shown in FIG. 3 besides the point that the portions of the line memory circuit and the reading circuit are different. The line memory circuits 133 include retaining capacitance Cts retaining signal components (S) of photoelectric conversion elements 110 selected with a vertical shift register circuit 120. A horizontal shift register circuit 140 selects two pieces of data at a time from the signal data in a line retained in the line memory circuits 133 simultaneously. The reading circuit comprises gain amplifiers 152a and 152b which amplify and output the data (signal components (S)) selected with the horizontal shift register circuit 140 respectively. To the input terminal of the gain amplifier 152a, the common output line Ch1s is connected, and to the input terminal of the gain amplifier 152b, the common output line Ch2s is connected. To the common output line Ch1s, lines including the retaining capacitor Cts of the photoelectric conversion elements 110 on the odd rows are connected commonly. To the common output line Ch2s, lines including the retaining capacitance Cts of the photoelectric conversion elements 110 on the odd rows are connected commonly.

In case of the circuit configuration shown in FIG. 10, in the common output line forming areas 401a and 401b, wiring layers corresponding with the common output lines Ch1s and Ch2s respectively are formed. In case of applying the structure of the first to third and seventh embodiments, with the dummy inner lenses being made not to overlap with any of the wiring layers of the common output lines, correct reading of signal components (S) can be implemented and high sensitivity can be retained. Also in case of applying the structure of the fourth to sixth embodiments, setting the pitch for the dummy inner lenses and the pitch for the wiring layers of respective common output lines to the same, correct reading of signal components (S) can be implemented.

Here, in the circuit configuration shown in FIG. 10, when coupling capacitance arises between a common output line and the other wiring, dispersion between the respective gain amplifiers 152a and 152b in the output arises, and therefore in case of displaying an image based on the output of the solid state image pickup device, a problem of mixed color occurs. The case of applying the structure of the first to third embodiments does not give rise to coupling capacitance, and therefore can prevent the problem of mixed color. The case of applying the structure of the fourth to sixth embodiments can equalize coupling capacitance in the respective common output lines, and therefore can prevent the problem of mixed color in this case as well.

Figure 11:
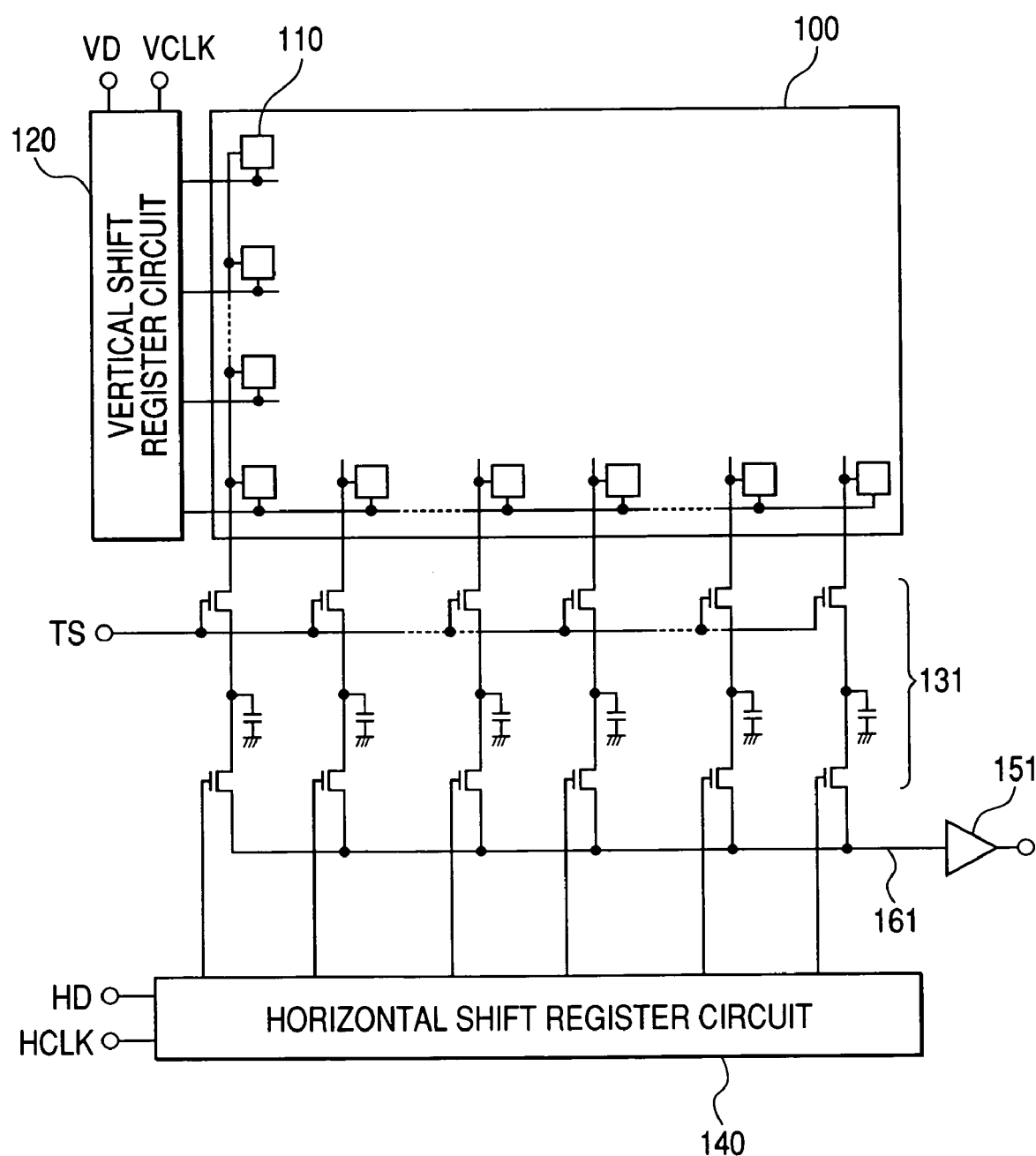
FIG. 11 is a block diagram showing another example of a circuit configuration to which the structure of the solid state image pickup device of the present invention is applicable.

In addition, the first to third and seventh embodiment can be applied to the circuit configuration as shown in FIG. 11. This circuit is basically likewise the one shown in FIG. 13 besides the point that the portions of the line memory circuit and the reading circuit are different. The line memory circuits 131 retain signal components (S) of photoelectric conversion elements 110 selected with a vertical shift register circuit 120. A horizontal shift register circuit 140 selects a piece of data at a time from the signal data retained in the line memory circuits 130. The reading circuit comprises a gain amplifier 151 which amplifies and outputs the data signal (signal components (S)) selected with the horizontal shift register circuit 140. The output terminals of the photoelectric conversion elements 110 are connected to the common output line 161 which is connected to the input terminal of the gain amplifier 151 on a row-by-row basis.

In case of the circuit configuration shown in FIG. 11, wiring layers corresponding with common output line 161 are formed in the line forming areas 401a and 401b. With the dummy inner lenses being made not to overlap with the wiring layers of the common output line, correct reading of signal components (S) can be implemented and high sensitivity can be retained.

The solid state image pickup device of the present invention having been described so far in the first to seventh embodiments can be applied to the solid state image pickup system in scanners, video cameras, digital still cameras and the like. On a solid state image pickup system comprising the solid state image pickup device of the present invention, a configuration and operations thereof will be described in details as follows.

Figure 12:
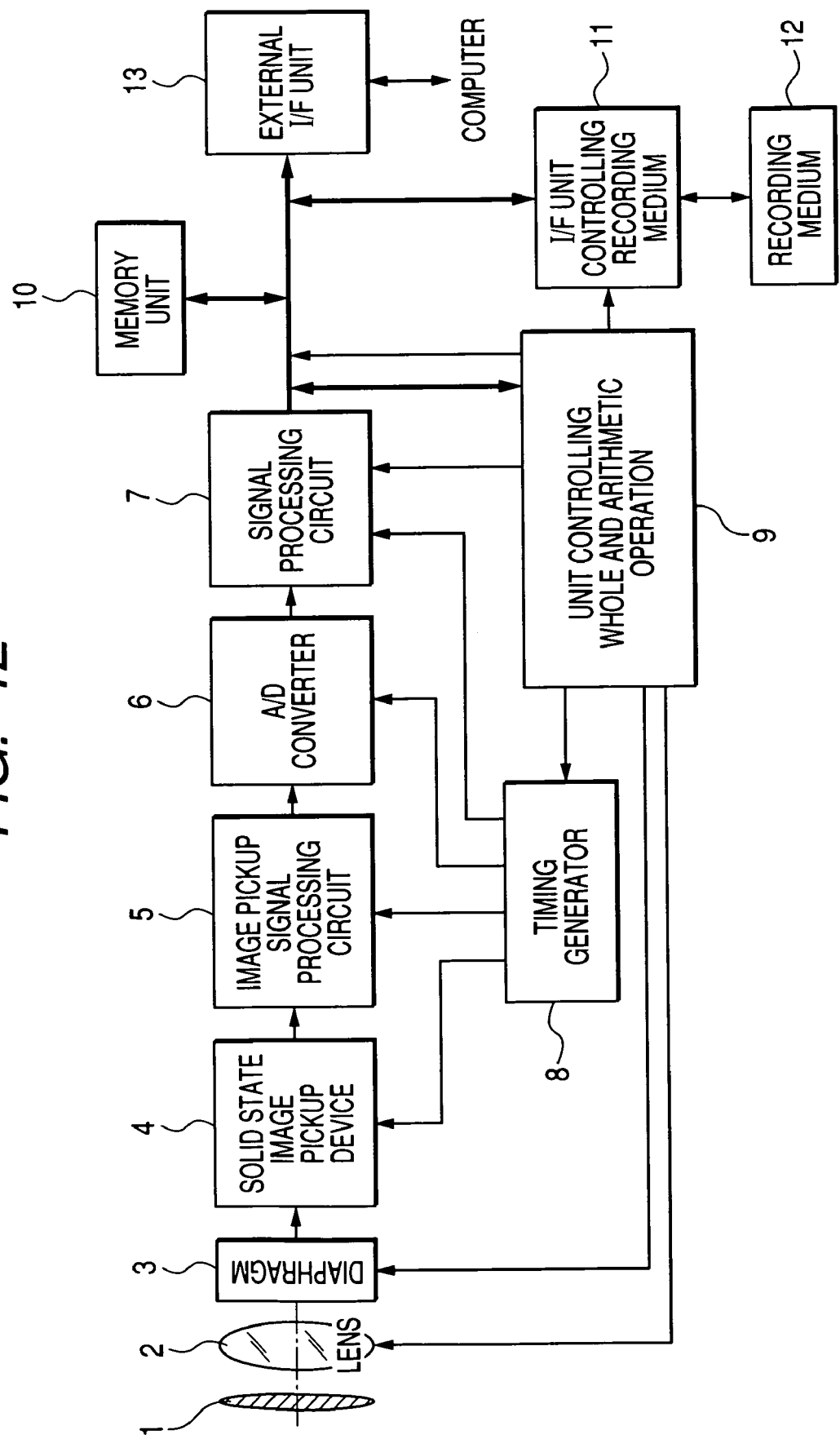
FIG. 12 is a block diagram showing an example of a solid state image pickup system that comprises a solid state image pickup device of the present invention.

FIG. 12 is a block diagram showing a schematic configuration of a solid state image pickup system comprising the solid state image pickup device of the present invention. This solid state image pickup system consists of a barrier 1, a lens 2, a diaphragm 3, a solid state image pickup device 4, an image pickup signal processing circuit 5, an A/D converter 6, a signal processing circuit 7, a timing generator 8, a unit controlling whole and arithmetic operation unit 9, a memory unit 10, a recording medium controlling interface unit 11, a recording medium 12 and an external interface (I/F) unit 13.

The barrier 1 protects the lens as well as operates as the main switch. The lens 2 implements image forming of an optical image of a subject to be imaged onto the solid state image pickup device 4. The diaphragm 3 is for varying the luminous quantity that has passed the lens 2. The solid state image pickup device 4 is for taking in the subject brought into image forming with the lens 2 as an image signal, and comprises a structure of the solid state image pickup device of any of the first to sixth embodiments.

The image pickup signal processing circuit 5 implements processing such as respective types of corrections and clamps etc. to the image signals outputted from the solid state image pickup device 4. The A/D converter 6 implements analog-digital conversion on the image signals outputted from the solid state image pickup device 4. The signal processing circuit 7 implements respective types of corrections to the image data outputted from the A/D converter 6 and compresses the data etc. The timing generator 8 supplies the solid state image pickup device 4, the image pickup signal processing circuit 5, the A/D converter 6 and the signal processing circuit 7 with respective types of timing signals respectively. These image pickup signal processing circuit 5, A/D converter 6, signal processing circuit 7 and timing generator 8 may be formed on the same chip as the solid state image pickup device 4.

The unit controlling whole and arithmetic operation unit 9 controls respective types of calculations and the entire system. The memory unit 10 is for temporally storing image data. The recording medium controlling interface unit 11 records to or reads from the recording medium 12. The recording medium 12 is a removable recording medium such as a semiconductor memory etc. The external I/F unit 13 communicates with an external computer etc.

Next, operations of the present solid state image pickup system will be described. When the barrier 1 is opened, the main power supply, the power supply of the control system and the power supply of circuits of the image pick up system such as the A/D converter 6 etc. are sequentially turned on.

When the power supply is turned on, in order to control light exposure, the unit controlling whole and arithmetic operation unit 9 opens the diaphragm 3. Signals outputted from the solid state image pickup device 4 are supplied to the A/D converter via the image pickup signal processing circuit 5, and undergo A/D conversion. The signals that have undergone A/D conversion are supplied to the signal processing circuit 7. The signal processing circuit 7 calculates exposure based on the supplied signals through the unit controlling whole and arithmetic operation unit 9. This operation implements photometry, and according to the outcome, lightness is determined. In addition, corresponding with the determination result, the unit controlling whole and arithmetic operation unit 9 controls the diaphragm.

Next, the unit controlling whole and arithmetic operation unit 9 takes out high frequency components based on the signals outputted from the solid state image pickup device 4 and calculates the distance to the subject. Thereafter, the unit controlling whole and arithmetic operation unit 9 drives the lens 2 to determine whether a focused state is derived or not. In case of determining that the focused state is not derived, the unit controlling whole and arithmetic operation unit 9 drives the lens 2 again to implement ranging.

Subject to confirmation of the focused state, the actual exposure starts. When the actual exposure ends, the image signals outputted from the solid state image pickup device 4 undergo correction etc. in the image pickup signal processing circuit 5, and thereafter undergo A/D conversion with the A/D converter 6. The image signals subject to A/D conversion are stored in the memory unit 10 with the unit controlling whole and arithmetic operation unit 9 through the signal processing circuit 7. Thereafter, the data stored in the memory unit 10 are recorded to a removable recording medium 12 such as a semiconductor memory etc. with the unit controlling whole and arithmetic operation unit 9 through the recording medium controlling I/F unit 11. In addition, the data may be inputted directly to an external computer etc. through the external interface (I/F) unit 13 to implement processing of the image.

This application claims priority from Japanese Patent application No. 2004-243602 filed on Aug. 24, 2004, which is hereby incorporated by reference herein.

What is claimed is:

1. An image pick-up apparatus comprising:
    a photoelectric conversion area comprising a plurality of pixels arranged at a semiconductor substrate,
    a peripheral circuit area for reading a signal from the photoelectric conversion area,
    a common output line arranged at the peripheral circuit area for transmitting the signal from the photoelectric conversion area,
    an inner lens arranged on an insulating layer covering a layer comprising the common output line,
    a color filter arranged on the inner lens, and
    a micro lens arranged on the color filter,
    wherein the inner lens arranged without being overlapped with the common output line and the color filter arranged on the peripheral circuit area.

2. The image pick-up apparatus according to claim 1, wherein said signal includes a first signal component corresponding with an image signal and a second signal component corresponding with a noise signal, and said common output line includes a first common output line transmitting said first signal component and a second common output line transmitting said second signal component.

3. The image pick-up apparatus according to claim 2, wherein said inner lens has a convex shape to incident light.

4. The image pick-up apparatus according to claim 3, wherein a lens material layer of forming said inner lens is arranged with substantially uniform film thickness on said peripheral circuit area.

5. The image pick-up apparatus according to claim 4, comprising a lens material layer having substantially uniform film thickness around said inner lens in said pixel area, wherein the lens material layer arranged in said pixel area has substantially the same film thickness as the lens material layer arranged on said peripheral circuit area.

6. An image pick-up system comprising the image pick-up apparatus according to claim 1, a lens of forming image of an optical image of a subject onto a photo-detect plane of said image pick-up apparatus, and signal processing means of deriving an image signal of said subject from an output of said image pick-up apparatus.

* * * * *

UNITED STATES PATENT AND TRADEMARK OFFICE
CERTIFICATE OF CORRECTION

PATENT NO. : 7,294,818 B2
APPLICATION NO. : 11/207755
DATED : November 13, 2007
INVENTOR(S) : Takashi Matsuda et al.

It is certified that error appears in the above-identified patent and that said Letters Patent is hereby corrected as shown below:

TITLE PAGE, ITEM [57] ABSTRACT

Line 5, "where" should read --with--.

COLUMN 2

Line 14, "out lines 160." should read --output lines 160.--.

COLUMN 3

Line 64, "aria" should read --area--.

COLUMN 5

Line 35, "a inner" should read --an inner--.
Line 36, "line" should read --line,--.

COLUMN 6

Line 21, "lenses;" should read --lenses is applicable;--.

COLUMN 9

Line 6, Close up right margin and vertical space.
Line 19, "there above" should read --thereabove--.
Line 60, Close upright margin and vertical space.

COLUMN 10

Line 15, "areas 401" should read --areas 401a--.
Line 36, "are," should read --are--.
Line 67, "layer 208a." should read --layer 208b.--.

COLUMN 11

Line 35, "there above" should read --thereabove--.

UNITED STATES PATENT AND TRADEMARK OFFICE
CERTIFICATE OF CORRECTION

PATENT NO. : 7,294,818 B2
APPLICATION NO. : 11/207755
DATED : November 13, 2007
INVENTOR(S) : Takashi Matsuda et al.

It is certified that error appears in the above-identified patent and that said Letters Patent is hereby corrected as shown below:

COLUMN 12

Line 19, "is thickness" should read --its thickness is--.

COLUMN 13

Line 56, "embodiment" should read --embodiments--.

COLUMN 14

Line 19, "details" should read --detail--.
Line 66, "pick up" should read --pickup--.

COLUMN 15

Line 29, "subject" should read --subjected--.

COLUMN 16

Line 37, "of forming image" should read --for forming image--.

Signed and Sealed this

Twenty-fourth Day of June, 2008

JON W. DUDAS
*Director of the United States Patent and Trademark Office*